United States Patent
Lai et al.

(10) Patent No.: US 10,043,819 B1
(45) Date of Patent: Aug. 7, 2018

(54) METHOD FOR MANUFACTURING 3D NAND MEMORY USING GATE REPLACEMENT, AND RESULTING STRUCTURES

(71) Applicant: MACRONIX INTERNATIONAL CO., LTD., Hsinchu (TW)

(72) Inventors: Erh-Kun Lai, Tarrytown, NY (US); Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/597,965

(22) Filed: May 17, 2017

(51) Int. Cl.
*H01L 27/11* (2006.01)
*H01L 23/52* (2006.01)
(Continued)

(52) U.S. Cl.
CPC .... *H01L 27/11582* (2013.01); *H01L 23/5283* (2013.01); *H01L 27/11565* (2013.01);
(Continued)

(58) Field of Classification Search
CPC .......... H01L 27/11582; H01L 23/5283; H01L 27/11565; H01L 27/11578; H01L 29/7926;
(Continued)

(56) References Cited

U.S. PATENT DOCUMENTS 6,912,163 B2   6/2005   Zheng et al.
7,612,403 B2   11/2009   Bhattacharyya
(Continued)

FOREIGN PATENT DOCUMENTS

JP   2011060991 A   3/2011
JP   2011514013 A   4/2011
(Continued)

OTHER PUBLICATIONS

Arya, Pranav, "3D Nand Flash Memory," IEE5008 Memory Systems,—Autumn 2012, 43 pages. In accordance with MPEP 609.04 (a), the year of this publication is sufficiently earlier than the effective U.S. filing date, Sep. 24, 2010, so that the particular month of publication is not an issue. See MPEP 609.04 (a).
(Continued)

*Primary Examiner* — Caleen Sullivan
(74) *Attorney, Agent, or Firm* — Haynes Beffel & Wolfeld LLP

(57) ABSTRACT

A 3D memory device includes a plurality of vertical pillars composed of a vertical channel and a multilayer data storage structure. The multilayer data storage structure can comprise a dielectric charge trapping structure. A stack of dielectric lined conductive strips separated in the stack by insulating strips have sidewalls disposed adjacent the corresponding vertical pillars. The conductive strips have a dielectric liner having a dielectric constant $\kappa$ greater than 7 on the sidewalls in contact with the outside layer of the multilayer data storage structure on the corresponding pillar. The conductive strips in embodiments described herein can comprise a relatively low resistance material, such as a metal or a metal nitride. A manufacturing method using Si—Ge selective etching of sacrificial layers can be used in a gate replacement process to form the dielectric conductive strips.

14 Claims, 18 Drawing Sheets

(51) Int. Cl.

| | |
|---|---|
| *H01L 21/82* | (2006.01) |
| *H01L 27/11582* | (2017.01) |
| *H01L 27/11565* | (2017.01) |
| *H01L 23/528* | (2006.01) |
| *H01L 27/11575* | (2017.01) |
| *H01L 27/11578* | (2017.01) |
| *H01L 27/11573* | (2017.01) |
| *H01L 27/11551* | (2017.01) |
| *H01L 27/11524* | (2017.01) |
| *H01L 21/8239* | (2006.01) |
| *H01L 29/792* | (2006.01) |
| *H01L 29/66* | (2006.01) |
| *H01L 29/788* | (2006.01) |
| *G11C 16/04* | (2006.01) |

(52) U.S. Cl.
CPC .. H01L 27/11573 (2013.01); H01L 27/11575 (2013.01); H01L 27/11578 (2013.01); *G11C 16/0483* (2013.01); *G11C 2211/4016* (2013.01); *G11C 2213/71* (2013.01); *G11C 2213/75* (2013.01); *H01L 21/8239* (2013.01); *H01L 27/11524* (2013.01); *H01L 27/11551* (2013.01); *H01L 29/66833* (2013.01); *H01L 29/7889* (2013.01); *H01L 29/7926* (2013.01)

(58) Field of Classification Search
CPC ........... H01L 27/1157; H01L 27/11573; H01L 27/11575; H01L 29/66833; H01L 29/792; H01L 21/8239; H01L 27/11524; H01L 27/11551; H01L 29/7889; G11C 16/0483; G11C 2213/71; G11C 2211/4016; G11C 2213/75
USPC ......................................................... 257/324
See application file for complete search history.

(56) References Cited

U.S. PATENT DOCUMENTS

| | | | |
|---|---|---|---|
| 7,714,377 | B2 | 5/2010 | Specht et al. |
| 7,816,727 | B2 | 10/2010 | Lai et al. |
| 7,906,818 | B2 | 3/2011 | Pekny |
| 8,013,383 | B2 | 9/2011 | Kidoh et al. |
| 8,163,616 | B2 | 4/2012 | Kang et al. |
| 8,203,187 | B2 | 6/2012 | Lung et al. |
| 8,208,279 | B2 | 6/2012 | Lue |
| 8,363,476 | B2 | 1/2013 | Lue et al. |
| 8,437,192 | B2 | 5/2013 | Lung et al. |
| 8,441,059 | B2 | 5/2013 | Sim et al. |
| 8,467,219 | B2 | 6/2013 | Lue |
| 8,625,322 | B2 | 1/2014 | Samachisa et al. |
| 8,644,077 | B2 | 2/2014 | Lue et al. |
| 8,674,426 | B2 | 3/2014 | Higuchi et al. |
| 8,681,555 | B2 | 3/2014 | Liu |
| 8,853,818 | B2 | 10/2014 | Lue |
| 8,900,984 | B2 | 12/2014 | Nakao et al. |
| 8,917,557 | B2 | 12/2014 | Sakaguchi et al. |
| 9,147,468 | B1 | 9/2015 | Lue |
| 9,230,979 | B1 | 1/2016 | Pachamuthu et al. |
| 9,287,291 | B2 | 3/2016 | Lue |
| 9,324,730 | B2 | 4/2016 | Nam et al. |
| 9,362,302 | B1 | 6/2016 | Lai |
| 9,385,138 | B2 | 7/2016 | Sim et al. |
| 9,391,084 | B2 | 7/2016 | Lue |
| 9,397,110 | B2 | 7/2016 | Lue |
| 9,524,980 | B2 | 9/2016 | Lue |
| 9,520,485 | B2 | 12/2016 | Lue |
| 9,559,115 | B2 | 1/2017 | Sim et al. |
| 2006/0261401 | A1 | 11/2006 | Bhattacharyya |
| 2009/0184360 | A1 | 7/2009 | Jin et al. |
| 2010/0020617 | A1 | 1/2010 | Oh et al. |
| 2010/0155818 | A1 | 6/2010 | Cho et al. |
| 2011/0057249 | A1* | 3/2011 | Nakao ............... H01L 27/11578 257/324 |
| 2011/0175157 | A1 | 7/2011 | Sekine et al. |
| 2011/0298037 | A1 | 12/2011 | Choe et al. |
| 2012/0068241 | A1 | 3/2012 | Sakuma et al. |
| 2012/0182806 | A1 | 7/2012 | Chen et al. |
| 2012/0182808 | A1* | 7/2012 | Lue ................... G11C 16/0466 365/185.18 |
| 2012/0299086 | A1 | 11/2012 | Lee |
| 2012/0327714 | A1 | 12/2012 | Lue |
| 2013/0313627 | A1 | 11/2013 | Lee et al. |
| 2014/0001530 | A1 | 1/2014 | Song |
| 2014/0198570 | A1 | 7/2014 | Hsieh et al. |
| 2014/0231954 | A1 | 8/2014 | Lue |
| 2014/0239376 | A1 | 8/2014 | Zhang et al. |
| 2015/0372005 | A1* | 12/2015 | Yon ................... H01L 27/11582 257/5 |
| 2016/0197093 | A1 | 7/2016 | Omura |
| 2016/0260732 | A1 | 9/2016 | Lue |

FOREIGN PATENT DOCUMENTS

| | | |
|---|---|---|
| JP | 2011165815 A | 8/2011 |
| JP | 2013008712 A | 1/2013 |
| KR | 1020100074543 | 7/2010 |

OTHER PUBLICATIONS

Chen, Chih-Ping, et al., "A Highly Pitch Scalable 3D Vertical Gate (VG) NAND Flash Decoded by a Novel Self-Aligned Independently Controlled Double Gate (IDG) String Select Transistor (SSL)", Jun. 12-14, 2012, 2012 Symposium on VLSITechnology(VLSIT), pp. 91-92.

Choi et al., "3D approaches for non-volatile memory", 2011 Symposium on VLSI Technology, Digest of Technical Papers, pp. 178-179, Jun. 14-16, 2011.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

(56) References Cited

OTHER PUBLICATIONS

Orlowski et al., "Can 3-D Devices Extend Moore's Law Beyond the 32 nm Technology Node?" ECS Trans. 3(6), Oct. 29-Nov. 3, 2006, pp. 3-17.
Orlowski et al., "Si, SiGe, Ge, and III-V Semiconductor Nanomembranes and Nanowires Enabled by SiGe Epitaxy," ECS Trans. 33(6), Oct. 2010, pp. 777-789.
Sacchetto, et al., "Fabrication and characterization of vertically stacked Gate-All-Around Si Nanowire FET arrays," 2009 Proceedings of the European Solid State Device Research Conference, Athens, Sep. 2009, pp. 245-248.
Skotnicki, "Silicon-on-Nothing Nano Devices," SINANO Workshop @ ESSDERC Muenich, Sep. 14, 2007, 49 pages.
Tanaka et al., "Bit Cost Scalable Technology with Punch and Plug Process for Ultra High Density Flash Memory," VLSI Technology, 2007 IEEE Symposium on Jun. 12-14, 2007, pp. 14-15.
Wang, Michael, "Technology Trends on 3D-NAND Flash Storage", Impact 2011, Taipei, dated Oct. 20, 2011, found at www.impact.org.tw/2011/Files/NewsFile/201111110190.pdf, 29 pages.

\* cited by examiner

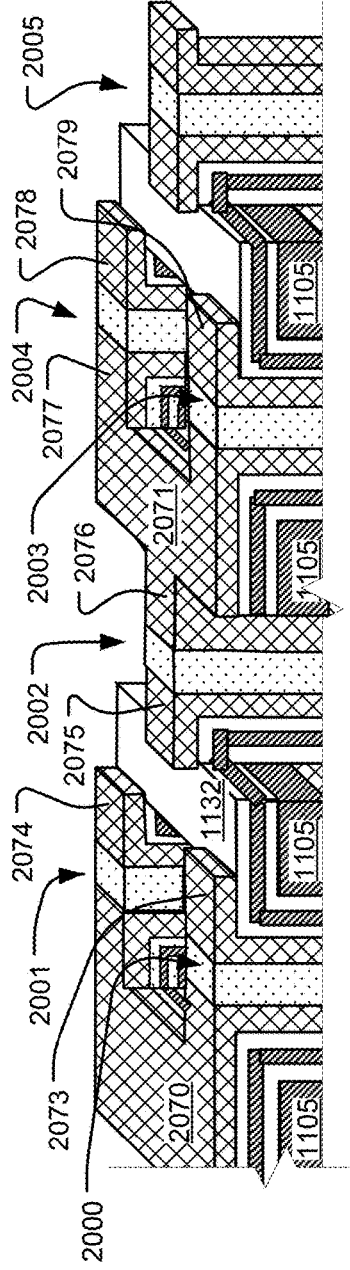
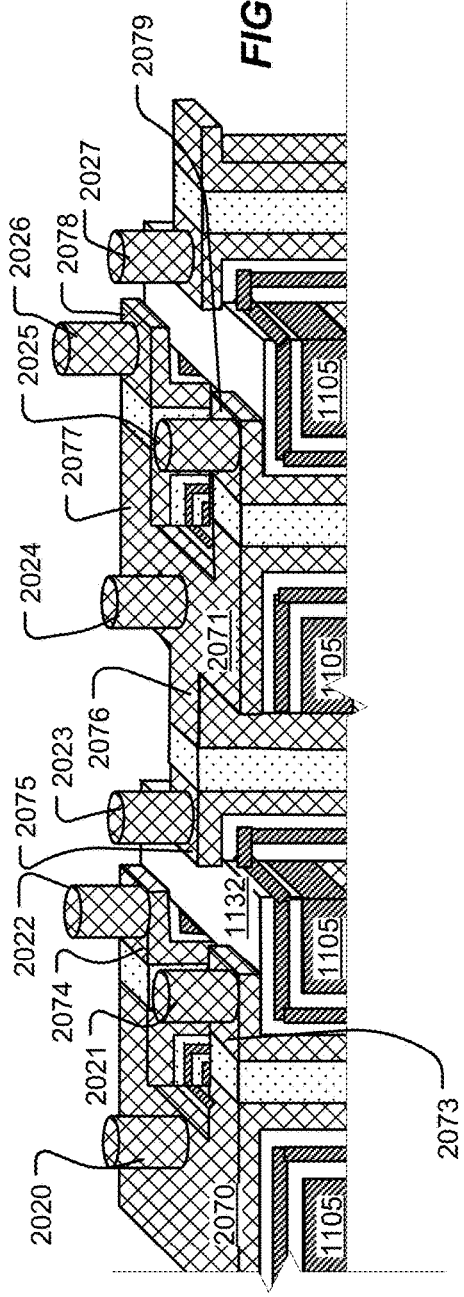

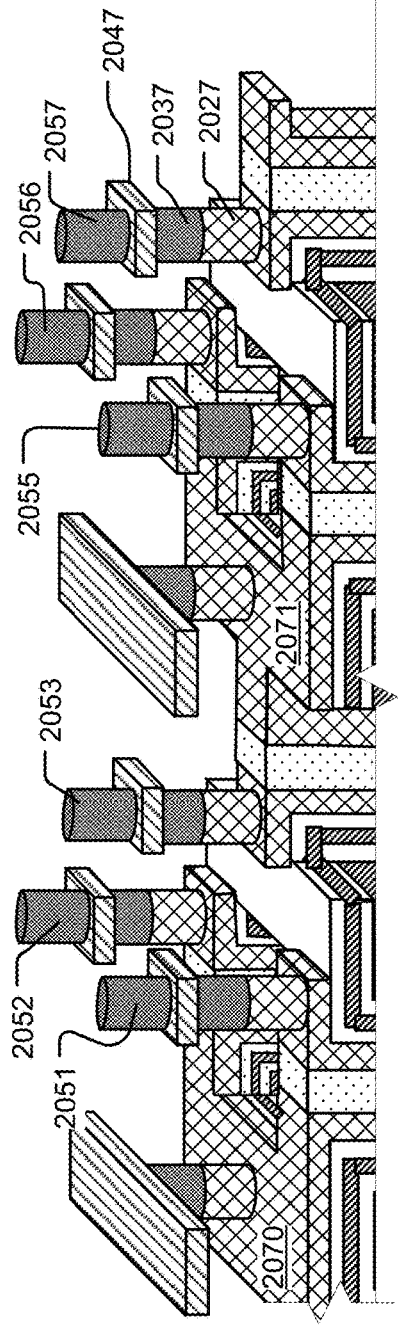
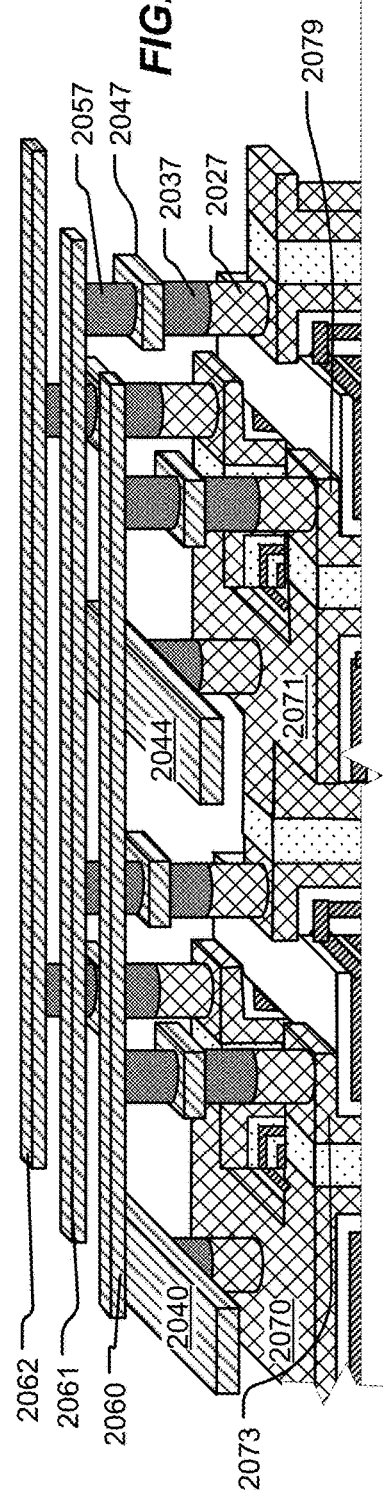

METHOD FOR MANUFACTURING 3D NAND MEMORY USING GATE REPLACEMENT, AND RESULTING STRUCTURES

BACKGROUND

Field of the Invention

The present invention relates to memories, and particularly relates to 3D NAND memories.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin-film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Another structure that provides vertical NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009. The structure described in Katsumata et al. includes a vertical NAND gate, using silicon-oxide-nitride-oxide-silicon SONOS charge trapping technology to create a storage site at each gate/vertical channel interface. The memory structure is based on a column of semiconductor material arranged as the vertical channel for the NAND gate, with a lower select gate adjacent the substrate, and an upper select gate on top. A plurality of horizontal word lines is formed using planar word line layers that intersect with the columns, forming a so-called gate all around the cell at each layer.

Another example of a memory structure includes a vertical thin-channel memory which can be configured as a 3D NAND flash memory. Vertical thin-channel cells in the memory are arranged along vertical active pillars which comprise U-shaped semiconductor thin films, providing a structure with semiconductor thin films on two sides electrically separated along the length of the pillar and electrically connected at the bottom. The active pillars are disposed between stacks of conductive strips operable as word lines with memory elements in between. As a result of this structure, two memory cells are formed per frustum of the active pillar, where each memory cell at the frustum includes a channel in the semiconductor thin-film on one side of the active pillar. A gap in insulation material between opposing vertical channel films may be included to suppress interference between back-to-back channels in U-turn architecture.

One problem associated with 3D memory structures arises because the word lines of stacked thin strips of polysilicon have relatively high resistance, and the resistance increases as the sizes of the structures shrink. Higher resistance word lines can result in slower operating speeds, and require higher power word line drivers. Although one approach to reducing resistivity of a semiconductor includes adjusting the doping concentrations, implant technology to change the doping concentrations for stacks of strips can be difficult to apply.

Also, the data storage structures formed for vertical structures can have limited quality, limiting cell reliability, retention times, and multibit-per-cell operations.

It is therefore desirable to provide a memory structure and method of manufacturing memory structures for vertical NAND and other 3D memory that can address the quality of the data storage structures, the high resistance of the word lines, or both.

SUMMARY

A memory device and a method for manufacturing a memory device are described which can improve the operating characteristics of 3D memory. In one embodiment, the memory device includes a plurality of memory cells, and comprises a plurality of vertical pillars composed of a vertical channel and a multilayer data storage structure. The multilayer data storage structure can comprise a dielectric charge trapping structure having a tunneling layer in contact with the vertical channel, a dielectric charge storage layer, and an outside layer acting as a blocking layer on the outside surface of the vertical pillar.

The memory device includes a stack of conductive strips separated in the stack by insulating strips. The conductive strips have sidewalls disposed adjacent the corresponding vertical pillars. Also, the conductive strips have a dielectric liner on the sidewalls in contact with the outside layer of the multilayer data storage structure on the corresponding vertical pillar. The conductive strips in embodiments described herein can comprise a relatively low resistance material, such as a metal or a metal nitride. Also, the conductive strips in some embodiments can comprise materials with a high work function.

The dielectric liner on the sidewalls of the conductive strips can comprise a high-κ material, and more preferably a material having a dielectric constant more than 7 (i.e. greater than the approximate dielectric constant of silicon nitride).

In some embodiments, the dielectric liner lines the upper and lower surfaces of the conductive strips in addition to the sidewalls. The dielectric liner can cooperate with the multilayer charge storage structure to improve the operational characteristics of the memory cells. Also, the dielectric liner can seal the structure during manufacturing processes to improve the quality and reliability of the resulting memory device.

Manufacturing methods are described which can be applied to form memory devices like those just described. In one technique, a plurality of vertical pillars is formed generally as follows:

forming alternating layers of an insulating material and a sacrificial material;

etching trenches in the alternating layers to form a plurality of stacks of sacrificial strips separated by insulating strips in the stacks; and forming multilayer data storage structures on the sidewalls of the trenches;

forming a semiconductor channel material over the multilayer data storage structures in the trenches; and etching holes through the semiconductor channel material to form vertical channels in the trenches, the holes exposing the sacrificial strips between the vertical pillars.

In one technique, a stack of conductive strips separated in the stacks by insulating strips is formed after etching holes in the semiconductor channel material to form the vertical channels, generally, as follows:

selectively removing the sacrificial strips in the stacks to form voids between the insulating strips;

lining the voids with a dielectric material to form the dielectric liners; and filling the voids over the dielectric liners with a word line material to form the conductive strips.

Using these methods, the sacrificial material can comprise silicon-germanium or other germanium based material, which can be selectively etched relative to the insulating material, such as silicon dioxide, with very high selectivity. As a result, the sacrificial strips can be removed with minimal damage to the exposed portions of the data storage structure.

Also using these methods, the dielectric liner can comprise a high-κ material, such as aluminum oxide or hafnium oxide, which can seal the data storage structure during the process for depositing the word line material in the voids, and improve its charge storage capabilities.

Furthermore, using these methods, the word line material can comprise a metal or metal nitride for example, such as tungsten or titanium nitride. These materials can be reliably deposited, can have relatively low resistance, and can have a high work function further contributing to the performance of the data storage structures of the memory cells.

Other aspects and advantages of the present invention can be seen on review of the drawings, the detailed description and the claims, which follow.

BRIEF DESCRIPTION OF THE DRAWINGS

FIGS. 6-18 illustrate structures during manufacturing stages for a 3D NAND as described herein.

DETAILED DESCRIPTION

A detailed description of embodiments of the present invention is provided with reference to the FIGS. 1-21.

Figure 1:
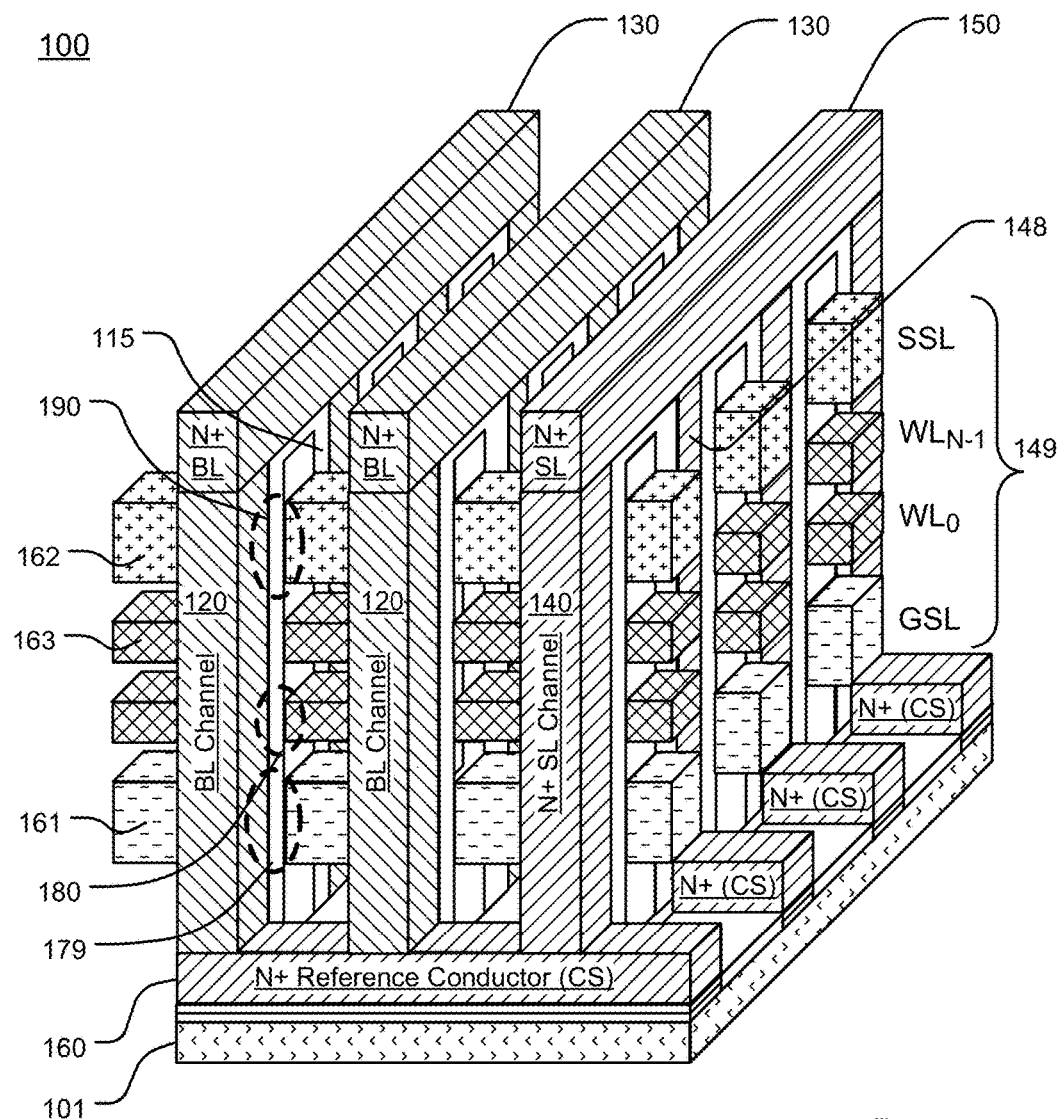
FIG. 1 is a simplified perspective diagram of a 3D memory device including vertical channel structures and word line stacks, the word lines having dielectric liners.

FIG. 1 is a perspective diagram of a three-dimensional 3D memory device 100 having an independent double gate structure with dielectric lined word lines, based on 3D vertical channel technology having a structure as described in U.S. Pat. No. 9,147,468, entitled MULTIPLE-BIT-PER-CELL, INDEPENDENT DOUBLE GATE, VERTICAL CHANNEL MEMORY, by H. T. Lue, issued 29 Sep. 2015, which is incorporated by reference as if fully set forth herein.

The memory device 100 includes an array of NAND strings of memory cells, configured in an independent double gate vertical channel memory array (IDGVC) with two NAND strings per vertical channel, and suitable for multiple-bit-per-cell data storage. The memory device 100 includes an integrated circuit substrate, and a plurality of stacks of conductive strips separated by insulating material, including at least a bottom plane of conductive strips (GSL), a plurality of intermediate planes of conductive strips (WLs), and a top plane of conductive strips (SSLs). In the example shown in FIG. 1, a stack 149 includes a bottom plane of conductive strips (GSL), a plurality of intermediate planes of conductive strips (WLs) ranging from $WL_0$ to $WL_{N-1}$, and a top plane of conductive strips (SSLs), where N can be 8, 16, 32, 64 and so on. Adjacent even word lines $WL_i$ and odd word lines $WL_{i+1}$ are connected to separate bias circuits (not shown), so that two charge storage sites at the frustums of each vertical channel structure between the adjacent word lines can be separately accessed and used for data storage. This arrangement of independent word lines can be implemented for example by connecting even word lines to a first bias structure, and odd word lines to a separate bias structure, examples of which are described below.

The conductive strips acting as word lines, string select lines and ground select lines can comprise a variety of materials including doped semiconductors, metals, and conductive compounds, including materials comprising Si, Ge, SiGe, SiC, TiN, TaN, W, and Pt. At least the conductive strips configured as word lines ($WL_0$ to $WL_{N-1}$) have dielectric liners, which in some embodiments are composed of high K materials.

Vertical channel structures (e.g. 120) are a part of a bit line structure in the memory device, and can comprise semiconductor materials adapted to act as channels for the memory cells, such materials as Si, Ge, SiGe, GaAs, SiC, and graphene.

In the illustrated example, the plurality of bit line structures are arranged orthogonally over, and have surfaces conformal with, the plurality of stacks, including inter-stack semiconductor body elements acting as vertical pillars between the stacks and linking elements 130 over the stacks connecting the inter-stack vertical channel structures 120. The linking elements 130 in this example comprise a semiconductor, such as polysilicon, having a relatively high doping concentration so that they have higher conductivity than the inter-stack vertical channel structures 120, which are configured to provide channel regions for the cells in the stacks. In alternative implementations, the linking elements can be part of overlying patterned metal layers, connected to the vertical pillars by interlayer connectors or plugs.

The memory device includes multilayer data storage structures, in interface regions at cross-points 180 between side surfaces of the even and odd conductive strips in the plurality of intermediate planes (WLs) in the stacks and the inter-stack vertical channel structures 120 of the plurality of bit line structures. The outer surfaces of the multilayer data storage structures contact the dielectric liners of the conductive strips.

The memory layer can include a multilayer data storage structure, known from flash memory technologies, including for example flash memory technologies known as ONO (oxide-nitride-oxide), ONONO (oxide-nitride-oxide-nitride-oxide), SONOS (silicon-oxide-nitride-oxide-silicon), BE- SONOS (bandgap engineered silicon-oxide-nitride-oxide-silicon), TANOS (tantalum nitride, aluminum oxide, silicon nitride, silicon oxide, silicon), and MA BE-SONOS (metal-high-κ bandgap-engineered silicon-oxide-nitride-oxide-silicon). In other embodiments, the memory layer can be a dielectric charge trapping structure like that shown in FIG. 19 below, as described in U.S. Pat. No. 9,391,084, entitled BANDGAP-ENGINEERED MEMORY WITH MULTIPLE CHARGE TRAPPING LAYERS STORING CHARGE, by H. T. Lue, issued 12 Jul. 2016, which is incorporated by reference as if fully set forth herein. In yet other embodiments, the data storage structure can comprise a floating gate structure, using for example a polysilicon charge storage layer.

In a representative device, the dielectric layer 115 of memory material can include a bandgap engineered composite tunneling dielectric layer comprising a layer of silicon dioxide less than 2 nm thick, a layer of silicon nitride less than 3 nm thick, and a layer of silicon dioxide less than 4 nm thick. In one embodiment, the composite tunneling dielectric layer consists of an ultrathin silicon oxide layer O1 (e.g. ≤15 Å), an ultrathin silicon nitride layer N1 (e.g. ≤30 Å) and an ultrathin silicon oxide layer O2 (e.g. ≤35 Å), which results in an increase in the valence band energy level of about 2.6 eV at an offset 15 Å or less from the interface with the semiconductor body. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields. These layers can be conformally deposited using for example LPCVD.

A charge trapping layer in the layer 115 of memory material in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

The blocking dielectric layer in the layer 115 of memory material in this embodiment comprises a layer of silicon dioxide having a thickness greater than 50 Å, including for example about 90 Å in this embodiment, and can be formed by LPCVD or other wet conversion from the nitride by a wet furnace oxidation process. Other blocking dielectrics can include high-κ materials like aluminum oxide.

The deposition techniques applied to form these layers of BE-SONOS ONO films and channel material can be carried out by conventional LPCVD processes. On the other hand, tools such as atomic layer deposition ALD tools can be utilized for these films. The gate dielectric layer in the regions of the SSL and GSL layers can have a different composition than the memory layer.

The combination of a vertical pillar including a channel structure and its data storage structures is referred to herein as an active pillar (e.g., active pillar 148). In the illustrated example, the memory cells in the cross-points 180 are configured in vertical NAND strings. In this configuration, two separate NAND strings are established on the opposing sides of a single inter-stack vertical channel structure. The two separate NAND strings can be operated independently for single-bit-per-cell or multiple-bit-per-cell, read, erase and program operations. In other embodiments, the vertical pillar can pass through the dielectric lined conductive strips configured as word lines, forming gate-all-around memory cells.

In the illustrated example, a reference conductor 160 is disposed between the bottom plane (GSL) of conductive strips and the integrated circuit substrate (not shown). At least one reference line structure is arranged orthogonally over the plurality of stacks, including inter-stack vertical conductive elements 140 between the stacks in electrical communication with the reference conductor 160, and linking contact pads 150 over the stacks (e.g. 149) connecting the inter-stack vertical conductive elements 140. The inter-stack vertical conductive elements 140 can be formed using the same material as the vertical channel structures 120, or can alternatively be formed using a material that provides a higher conductivity than the inter-stack vertical channel structures 120.

In the structure shown in FIG. 1, a string select line (e.g. 162) is disposed on each side of each active pillar (e.g. 148). Also, word lines (e.g. 163) are disposed on each side of each active pillar (e.g. 148). In addition, ground select lines (e.g. 161) are disposed on each side of each active pillar (e.g. 148).

The memory device includes string select switches 190 at interface regions with the top plane, or an upper level, of conductive strips, and reference select switches 179 at interface regions with the bottom plane (GSL) of conductive strips. The dielectric layers of the data storage structure can act as gate dielectric layers for the switches 179, 190 in some examples.

The memory device includes a first overlying patterned conductor layer (not shown) connected to the plurality of bit line structures, including a plurality of global bit lines coupled to sensing circuits. The memory device also includes a second overlying patterned conductor layer (not shown), which can be patterned, and can be above or below the first patterned conductor layer. The second overlying patterned conductor layer is connected to the at least one reference line structure, such as by contact to the linking contact pad 150. The second patterned conductor layer can connect the at least one reference line structure to a reference voltage source, or to circuitry for providing a reference voltage.

In the example shown in FIG. 1, the linking elements 130 of the bit line structures include N+ doped semiconductor material. The inter-stack vertical channel structures 120 of the bit line structures include undoped or lightly doped semiconductor material suitable for acting as channels. In the example shown in FIG. 1, the reference conductor 160 includes N+ doped semiconductor material, and the linking contact pads 150 of the at least one reference line structure include N+ doped semiconductor material. The inter-stack vertical conductive elements 140 of the at least one reference line structure also include N+ doped semiconductor material. In alternative implementations a metal or metal compound can be used in place of the doped semiconductors.

In one embodiment, in order to reduce the resistance of the reference conductor 160, the memory device can include a bottom gate 101 near the reference conductor 160. During read operations, the bottom gate 101 can be turned on by a suitable pass voltage applied to an underlying doped well or wells in the substrate, or other underlying patterned conductor structures, to increase the conductivity of the reference conductor 160.

Figure 2:
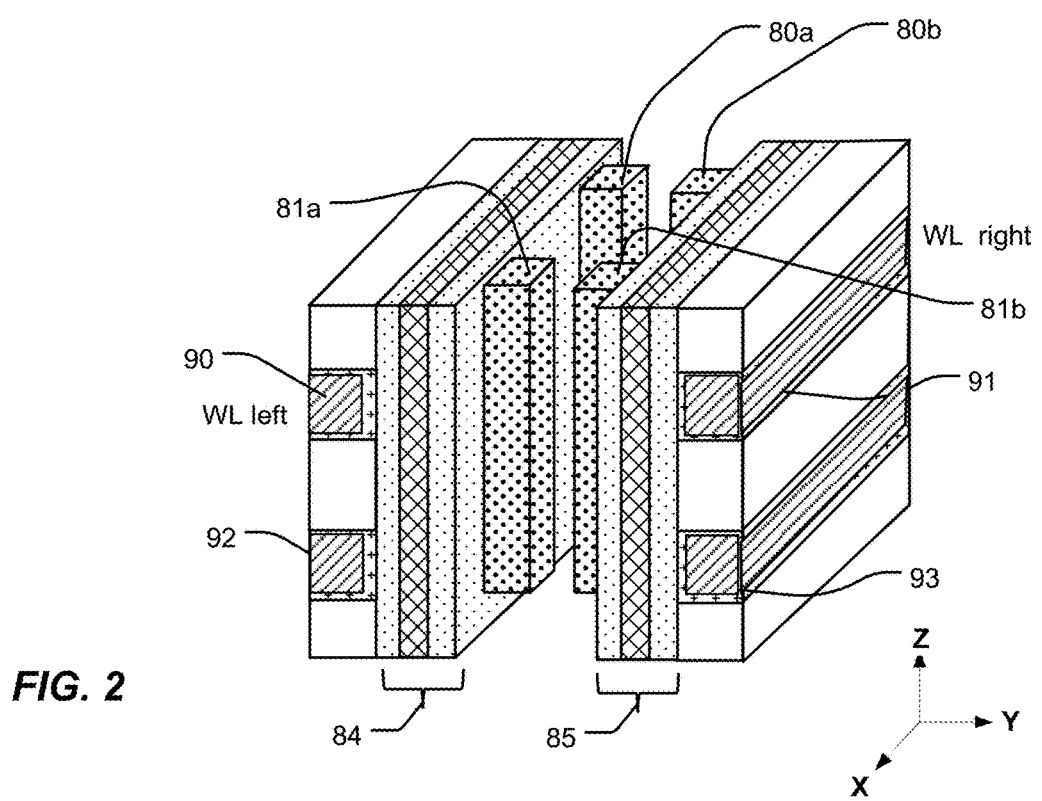
FIG. 2 is a perspective view of two frustums of an active vertical pillar having thin channel film structures separated by a gap and dielectric data storage structures which can be used with U-shaped NAND string embodiments.

FIG. 2 illustrates an intermediate section of an active pillar including two vertical channel films 80a/80b, and an active pillar including two vertical channel films 81a/81b, shown in the region of the word lines. In the illustration, the active pillars have vertical channel structures including even and odd thin-channel films split by a gap resulting in a first active pillar portion (vertical channel film 80a) formed of thin semiconductor film, and a second active pillar portion (vertical channel film 80b) formed of a thin semiconductor film and a first active pillar portion (vertical channel film 81a) and a second active pillar portion (vertical channel film 81b), both of which are formed of a thin semiconductor film. The data storage structures 84, 85 line sides of the word lines, including even word lines 90, 92 on the left and odd word lines 91, 93 on the right. The word lines 91 and 93 have dielectric liners as discussed above, which can be composed of high-κ materials.

Figure 3:
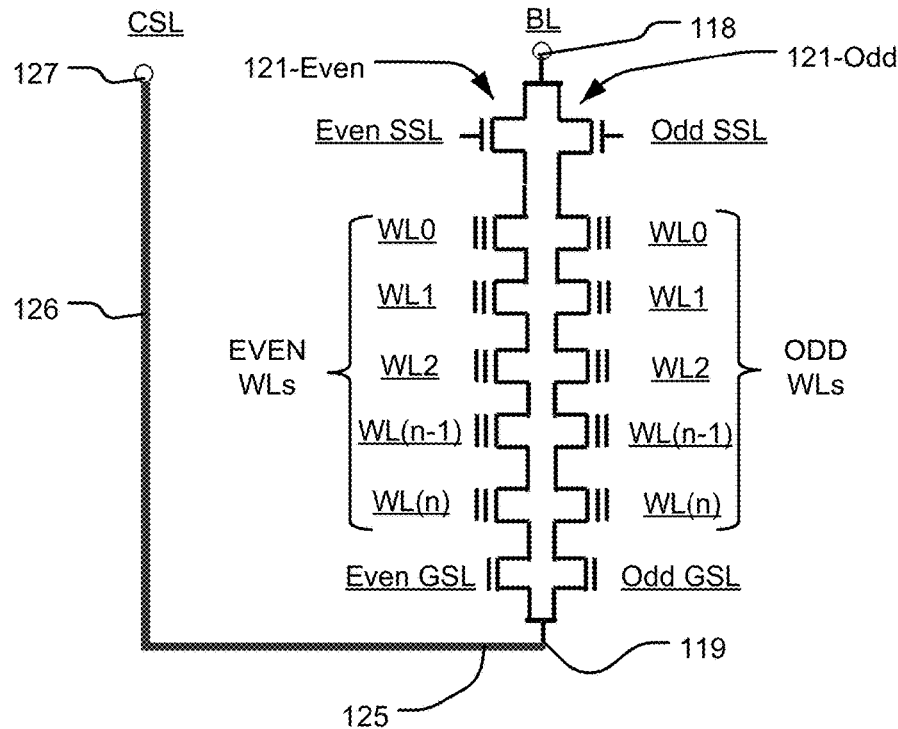
FIG. 3 is a schematic circuit diagram of NAND strings on a single active pillar in the structure of FIG. 1.

FIG. 3 is a circuit schematic of a single active pillar in the structure like that of FIG. 1, showing NAND strings on each side of the pillar. The active pillar extends from a bit line contact 118 (e.g., a connection to linking element 130 in FIG. 1) to a source line contact 119 (e.g. a connection to the reference conductor 160 in FIG. 1). The source line contact 119 connects the active pillar to a reference line 125, corresponding to the reference conductor 160 in FIG. 1. The reference line 125 is connected to an interlayer conductor 126 to a contact 127 for a patterned conductor which can act as a common source line CSL for the NAND array. As illustrated, the active pillar between contacts 118 and 119 includes an even NAND string 121-Even and an odd NAND string 121-Odd. The pillar is disposed between even and odd stacks of conductors, where an upper level in the even stack includes an even string select line and an upper level in the odd stack includes an odd string select line. Intermediate levels in the stack include even and odd word lines WL0 to WL(n) for respective even and odd NAND strings. A lower level in the stack includes an even ground select line GSL and an odd ground select line GSL.

Figure 4:
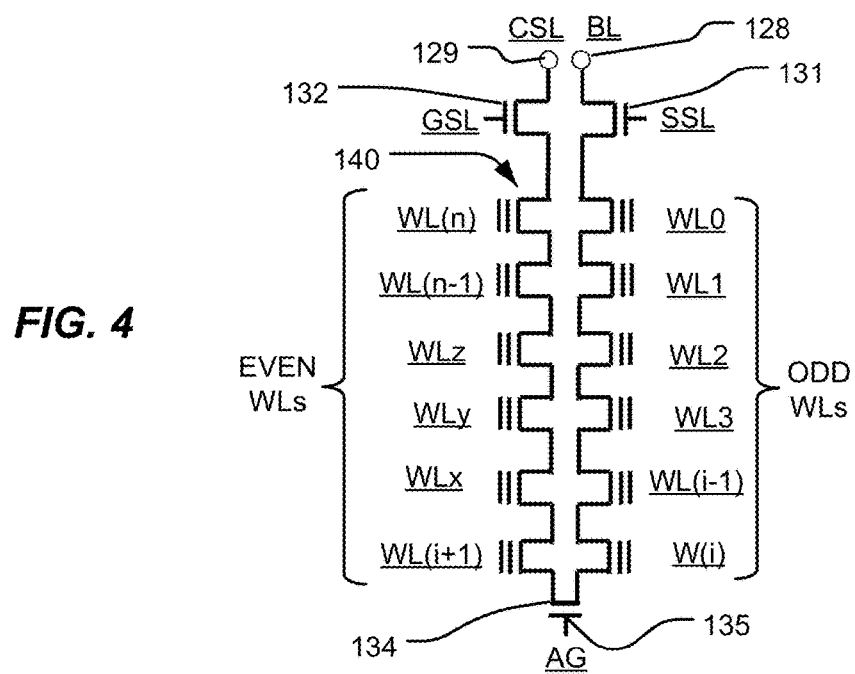
FIG. 4 is a schematic circuit diagram of a U-shaped NAND string on a single active pillar in a structure as described herein.

A memory structure is described herein, in which each active pillar provides thin-channel structures for the memory cells in a U-shaped NAND string, which can be implemented using structures like that of FIG. 2. A circuit schematic for a U-shaped NAND string in a single active pillar is shown in FIG. 4. The U-shaped NAND string is connected between a bit line contact 128 and a common source line contact 129. The active pillar is disposed between even and odd stacks of conductors, where an upper level in the odd stack in this example includes a string select line which acts as a gate for a first switch 131 in the NAND string, and an upper level in the even stack includes a ground select line which acts as a gate for a second switch 132 in the same NAND string. Intermediate levels in the stack include even and odd word lines, where the odd word lines include word line WL0 to word line WL(i), and the even word lines include word line WL(i+1) to word line WL(n). At the bottom 134 of the stack, the semiconductor thin films providing the thin-channel structures are electrically connected, such as being formed by a single continuous thin film which lines the space between the stacks of conductive strips. In the illustrated embodiment, an assist gate structure 135 is included which is coupled by a gate dielectric to the semiconductor thin film in the bottom of the stack. The assist gate structure 135 can be used to induce an inversion region that improves the conductivity of the strip between the even and odd sides. This assist gate can be implemented using a doped region in the substrate beneath the active pillars, or using other techniques. The U-shaped strings comprise series-connected even memory cells disposed on the side of the even stack and odd memory cells disposed on the side of the odd stack.

Figure 5:
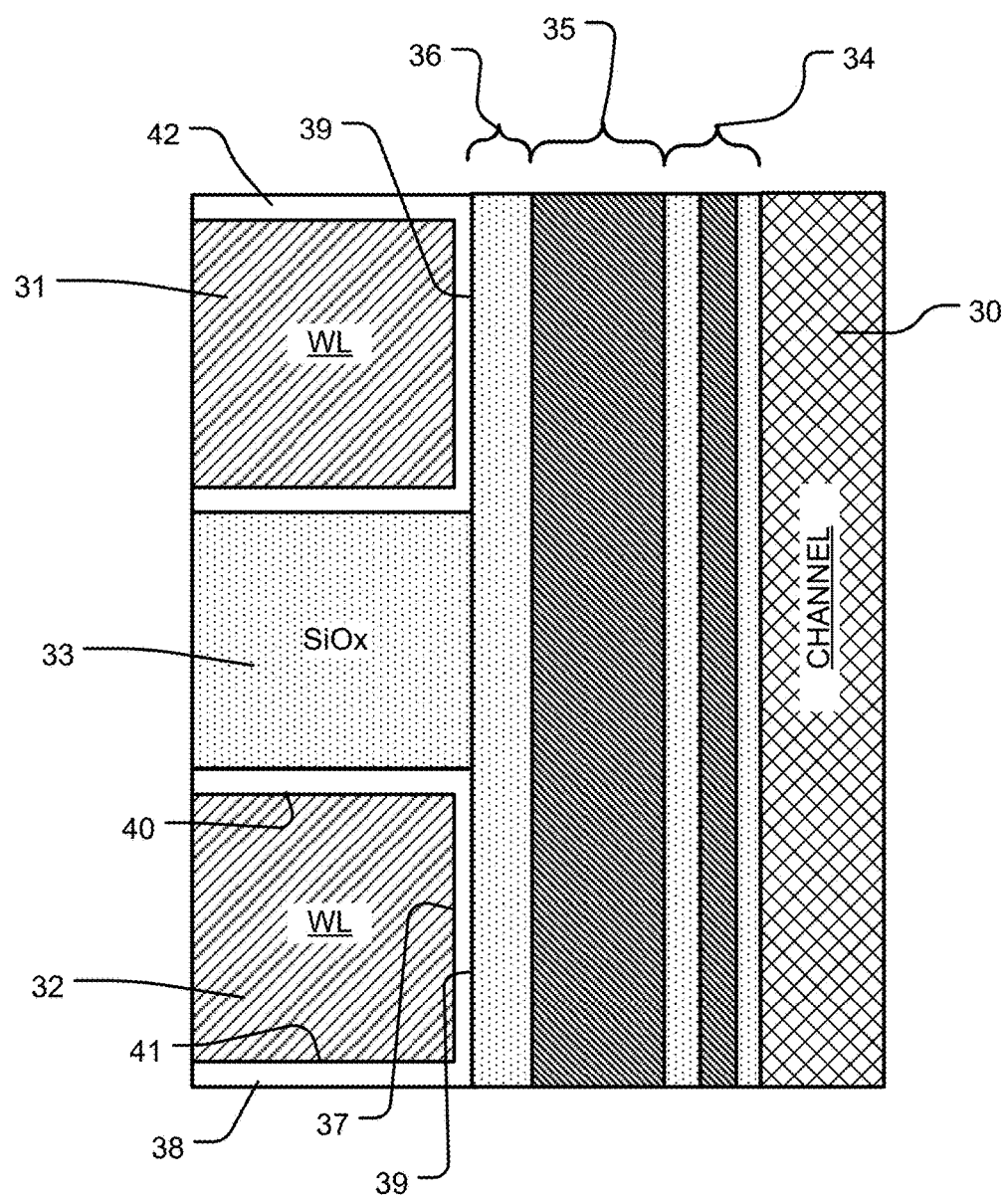
FIG. 5 is a cross-sectional view of a stack of word lines having dielectric lines in contact with an outer layer of a data storage structure in an active vertical pillar.

FIG. 5 is a cross-sectional view of a portion of a vertical pillar crossing a stack including horizontal conductive strips 31 and 32 which are configured as word lines and separated in the stack by an insulating strip 33. The vertical pillar comprises the vertical channel 30 formed of a semiconductor material such as polysilicon, polycrystalline silicon-germanium, polycrystalline germanium or other semiconductors. Also, the vertical pillar comprises a multilayer data storage structure, examples of which are discussed above. The multilayer data storage structure includes a tunneling layer 34 in this example having a first silicon oxide layer in contact with the vertical channel 30, a silicon nitride layer on the first silicon oxide layer, and a second silicon oxide layer on the silicon nitride layer. The multilayer data storage structure includes a dielectric charge storage layer 35, which in this example can be silicon nitride. The multilayer data storage structure includes a blocking layer 36, which has an outside surface 39. The blocking layer 36 can be a silicon dioxide, or other insulating material or combinations of material, including a high-κ material in some embodiments.

The horizontal conductive strips 31 and 32 can comprise a word line material such as a metal or doped semiconductor. In some embodiments the word line material comprises p+ polysilicon. N+ polysilicon may also be used. Other embodiments employ metals, metal compounds or combinations of metals and metal compounds for the conductive strips 31 and 32, such as platinum, tantalum nitride, metal silicides, aluminum or other metal or metal compound gate materials (e.g. from Ti, TiN, Ta, Ru, Ir, $RuO_2$, $IrO_2$, W, WN, and others. For some applications, it is preferable to use materials having work functions higher than 4 eV, preferably higher than 4.5 eV. A variety of high work function materials suitable for use as a word line materials in the conductive strips 31 and 32 are described in U.S. Pat. No. 6,912,163, entitled "MEMORY DEVICE HAVING HIGH WORK FUNCTION GATE AND METHOD OF ERASING SAME," issued 28 June 2005, by Wei Zheng et al., which is incorporated by reference as if fully set forth herein.

The insulating strip 33 can consist of silicon dioxide, for example. In other embodiments, the insulating strip 33 comprises comprise silicon dioxide, silicon nitride, other dielectric materials or combinations of dielectric material.

The horizontal conductive strips 31 and 32 have dielectric liners 42 and 38 respectively. The dielectric liners line the sidewall (e.g. 37) of the horizontal conductive strips, and contact the outside surface 39 of the outer layer of the multilayer data storage structure. Also, the dielectric liners 42 and 38 in this example line the upper surface (e.g. 40) and the lower surface (e.g. 41) of the horizontal conductive strips 31 and 32. The dielectric liners 42 and 38 can include high dielectric constant material, having for example a dielectric constant κ>7, such as $Al_2O_3$, $HfO_2$, $ZrO_2$, $La_2O_3$, AlSiO, HfSiO and ZrSiO etc., where $Al_2O_3$ and $HfO_2$ are preferred in some embodiments. The thickness of the high-κ dielectric liner can be in the range of 0.1 nm to 20 nm in some embodiments. Thicknesses in a range of 2 nm to 5 nm are preferred in some embodiments. In some embodiments the dielectric liners 42, 38 can comprise silicon nitride, which has a higher dielectric constant than silicon oxide for example. Also, the dielectric liners 42, 38 can comprise a different material than the material of insulating strip 33.

The dielectric liners 42, 38 can seal the contact region between the horizontal conductive strips 31, 32 and the multilayer data storage structure. Also, the dielectric liners 42, 38 can cooperate with the outer layer of the multilayer data storage structure to improve performance, including retention, leakage, endurance, tunneling characteristics and other performance measures for the memory cells in the memory device.

Figure 6:
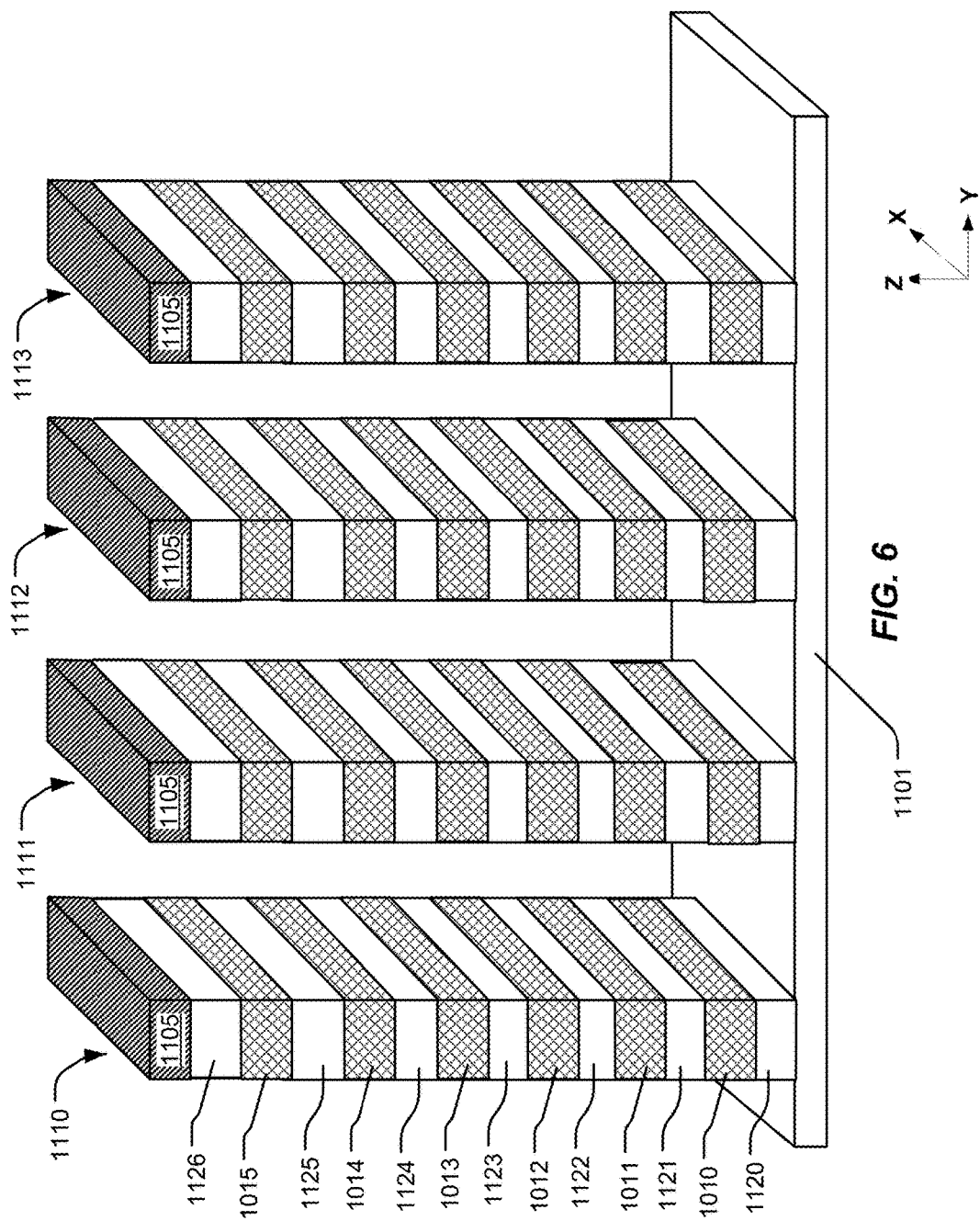

FIGS. 6 through 18 illustrate an example process flow for a vertical thin-channel film structure. FIG. 6 illustrates a stage of the process flow after forming an insulating layer 1101 which can comprise a silicon oxide or other dielectric on a semiconductor substrate.

To form the structure shown in FIG. 6, a plurality of layers of a sacrificial material such as epitaxial or polycrystalline germanium, epitaxial or polycrystalline silicon-germanium, or epitaxial or polycrystalline silicon, separated by layers of insulating material such as silicon dioxide or other insulating materials, are disposed over the insulating layer 1101. A layer of silicon nitride which can be used to provide tensile stress, is deposited over a top layer 1105, in this example. This layer can improve the uniformity of the stacks and reduce bending, when they are etched with high aspect ratios and narrow lines.

The layers of insulating material can comprise other insulating materials, and combinations of insulating materials. In this example, all of the insulating layers, with the exception of the top layer 1105, consist of the same material. In other examples, different materials can be used in different layers as suits a particular design goal. After the plurality of layers is formed, a patterned etch is applied to form a plurality of stacks of conductive strips separated in the stacks by insulating strips.

FIG. 6 illustrates a stage of the process after etching the plurality of layers, and stopping at the insulating layer 1101, to define a plurality of stacks of conductive strips, including stacks 1110, 1111, 1112 and 1113. The stacks 1110, 1111, 1112 and 1113 include at least a bottom plane of sacrificial strips 1010 which can correspond with conductive strips to be formed as assist gates for example, a plurality of intermediate planes of sacrificial strips 1011-1014 corresponding with conductive strips to be configured as word lines, and a top plane of sacrificial strips 1015 corresponding with conductive strips configured as string select lines or ground select lines. The plurality of intermediate planes can include N planes, ranging from 0 to N−1 for the stack. An insulating strip from the top layer 1105 of silicon nitride is disposed on each stack. The stacks 1110, 1111, 1112 and 1113 include layers of insulating strips 1120, 1121, 1122, 1123, 1124, 1125, 1126 as labeled in stack 1110, separating the sacrificial strips 1010-1015 from one another in the stacks.

Figure 7:
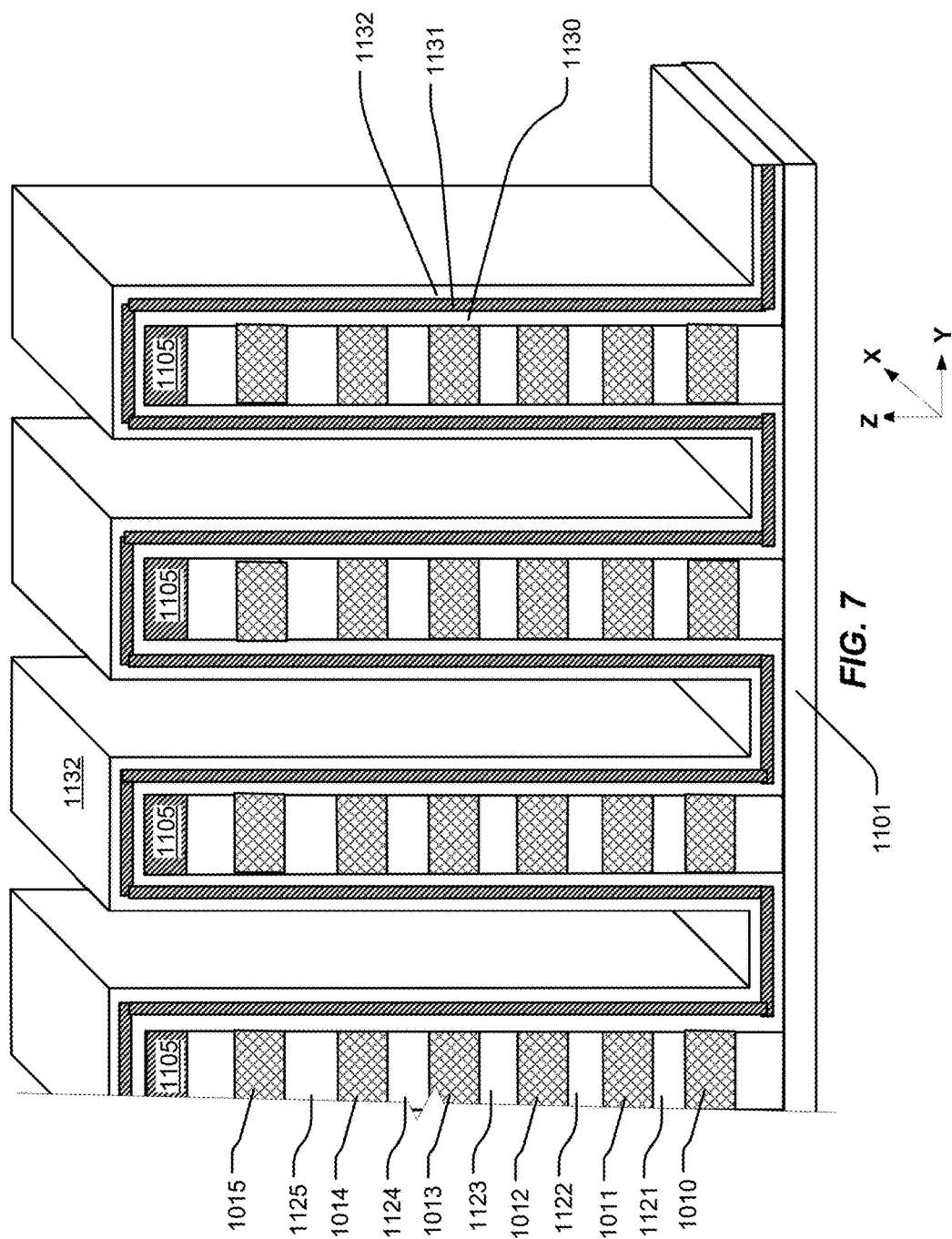

FIG. 7 illustrates a stage of the process flow after forming a memory layer over and on the sidewalls of the trenches, and thereby on the sides of sacrificial strips in the plurality of stacks for the purposes of forming a multilayer data storage structure as discussed above. The memory layer contacts the sidewalls of the plurality of sacrificial strips. The memory layer can comprise a multilayer data storage structure, as illustrated, including a tunneling layer 1132, a charge storage layer 1131, and a blocking layer 1130, examples of which are discussed above. In one preferred example, the memory layer is implemented as illustrated below with reference to FIG. 19.

Figure 8:
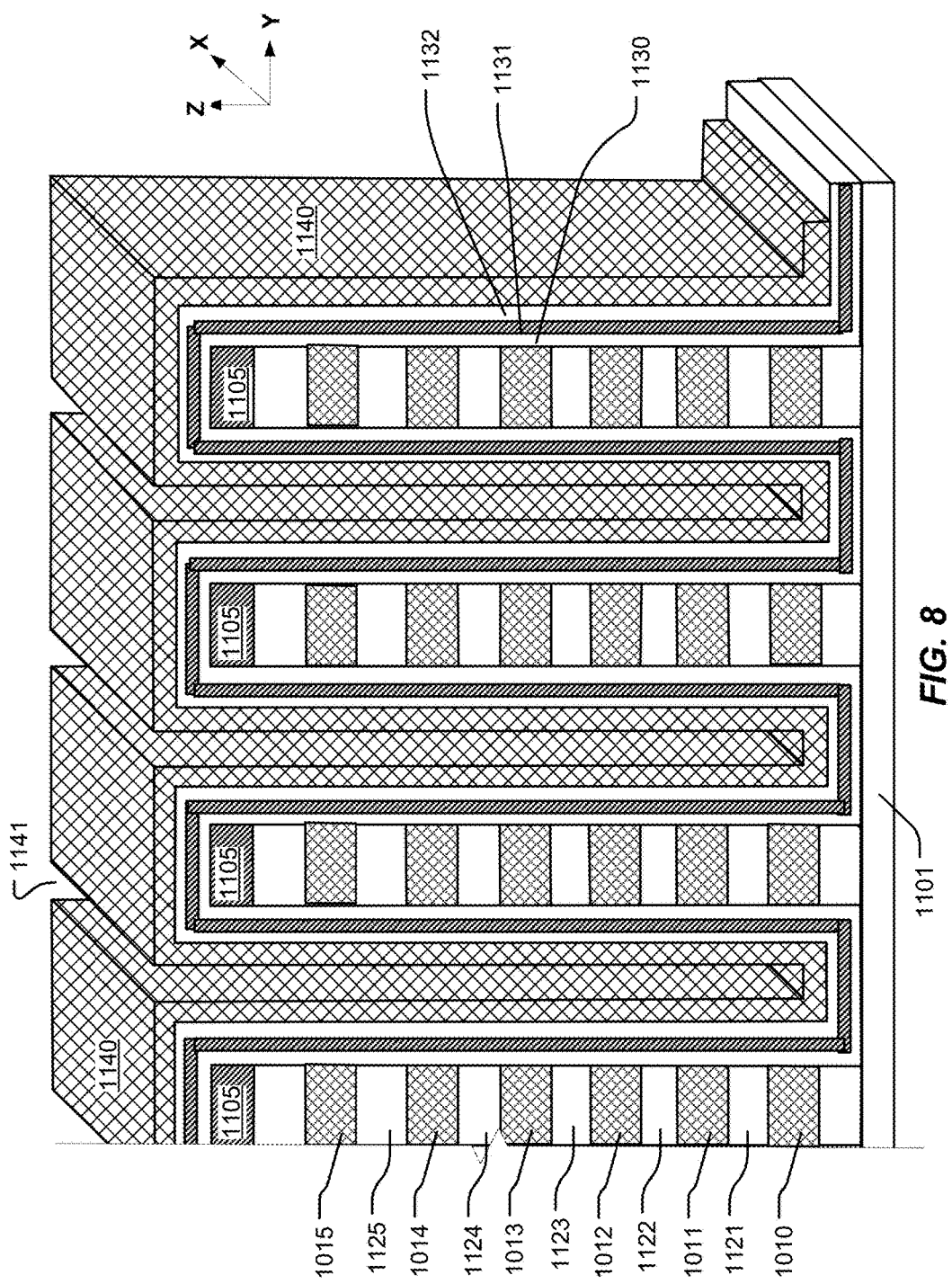

FIG. 8 illustrates a stage of the process flow after forming a thin layer 1140 of a semiconductor material suitable for use as a channel for the memory cells, over and having a surface conformal with, the multilayer data storage layer on the plurality of stacks. It is preferred that the thin layer 1140 comprise a material chosen for its compatibility with the sacrificial material, to support the selective removal of the sacrificial strips and subsequent steps without damage. In embodiments in which the sacrificial material comprises germanium or silicon germanium, the thin layer 1140 of semiconductor material can comprise polysilicon, such as lightly doped or undoped polysilicon. In embodiments in which the sacrificial material comprises polysilicon, the thin layer 1140 of semiconductor material can comprise germanium or silicon-germanium.

In the dielectric charge storage embodiment, the thin layer 1140 contacts the tunneling layer 1132 at least in the regions in which memory cells are being formed. The semiconductor material in layer 1140 comprises a semiconductor adapted by choice of material, e.g. silicon, and doping concentrations (e.g. undoped or lightly doped) to act as channel regions for vertical strings of memory cells, at least in the regions between the stacks. The thin layer 1140 can have a thickness of about 10 nanometers or less in some embodiments. As illustrated, in the regions 1141 between the stacks, the thin layer 1140 extends to the bottom of the trenches between the stacks, and overlies the insulating layer 1101. A thin layer of oxide can be formed over the thin layer 1140 by a short oxidation of the layer 1140.

Figure 9:
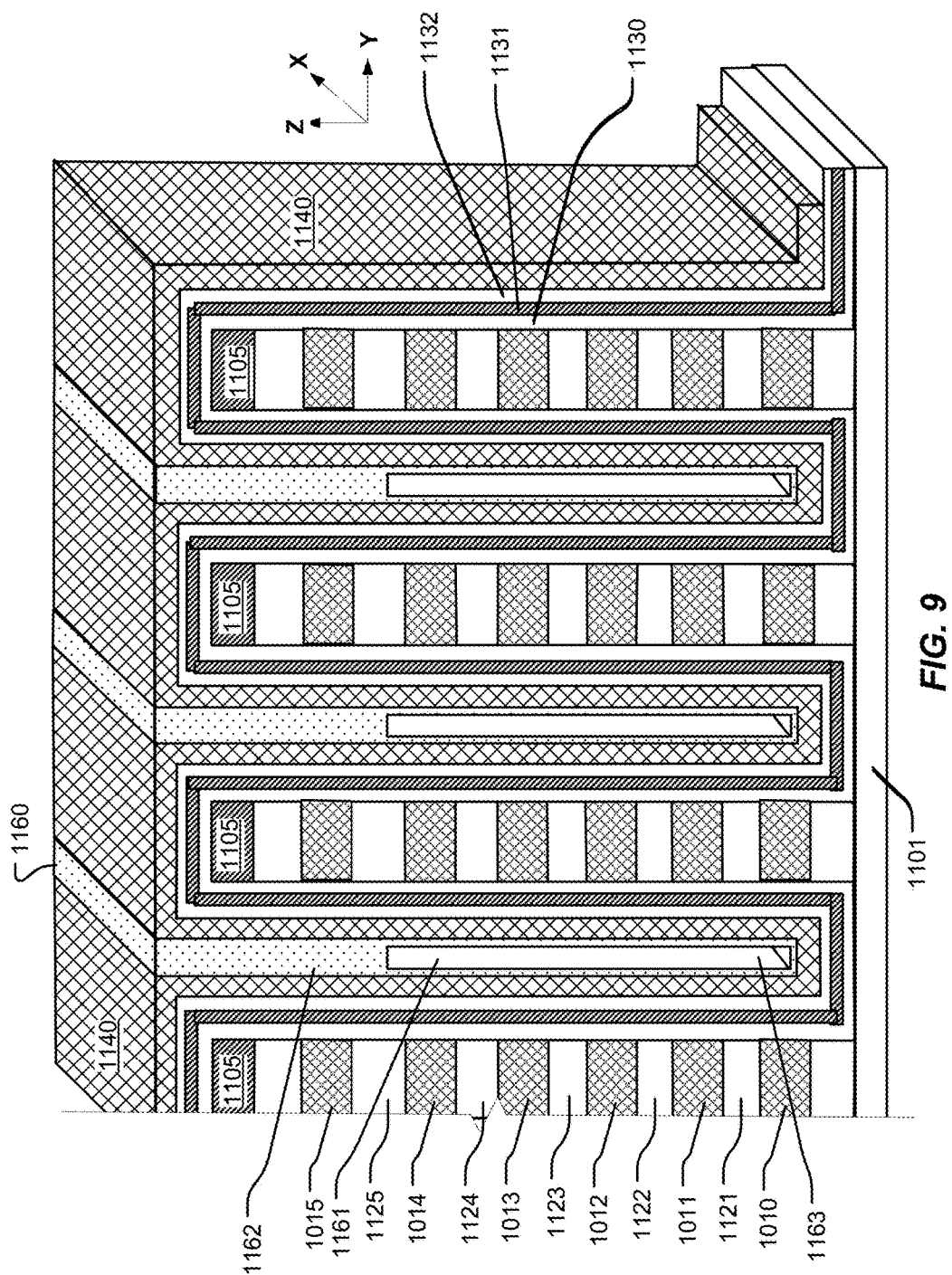

FIG. 9 illustrates a stage in the process flow after performing a step to fill between stacks on the inside surfaces of the thin-film semiconductor layer 1140 with an insulating material such as silicon dioxide, leaving an air gap in some embodiments at least in regions adjacent the intermediate layers of sacrificial strips. After the fill step, an etch back or planarizing step such as chemical mechanical polishing can be applied to expose the top surface of the thin-film semiconductor layer 1140. In the illustrated example, the fill 1160 includes gaps (e.g. 1161) in the regions of the memory cells. In the regions (e.g. 1162) adjacent the sacrificial strips in the top layer which can be used for string select lines and ground select lines, and in the regions (e.g. 1163) adjacent the sacrificial strips in the bottom layer which can be used for assist gate lines, the oxide material can completely fill the regions between the stacks. In other embodiments, an insulating liner can be formed which leaves a gap throughout the entire stack.

Figure 10:
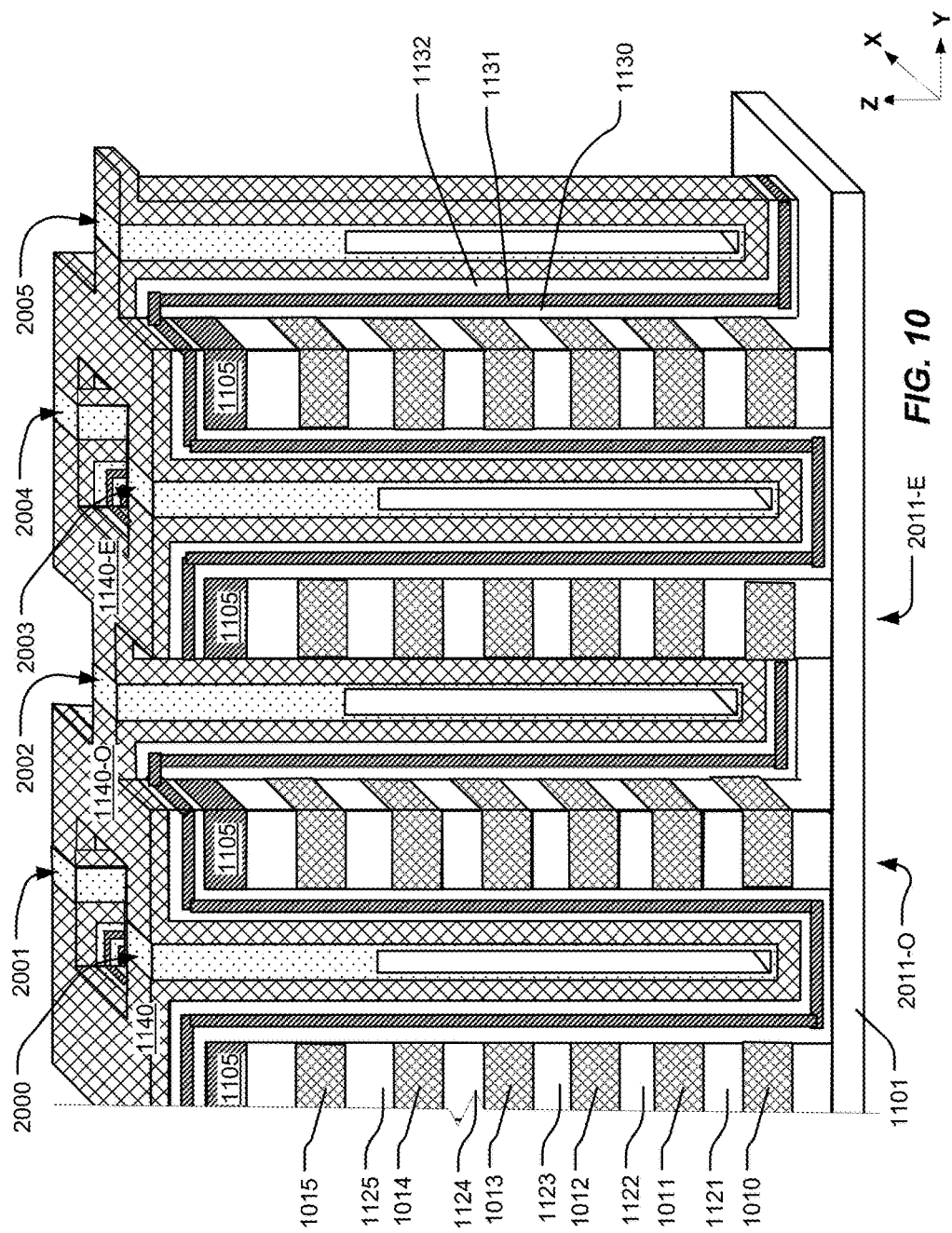

FIG. 10 illustrates a stage in the process after applying a pillar cut etch which includes etching holes between the stacks through the thin-film semiconductor layers to form a plurality of vertical pillars. Although the holes in the illustration are rectangular, this is shown for the purposes of the drawing. The holes can be oval or circular or take other shape as suits a particular etching technology applied. The holes extend in this example to expose the insulating layer 1101. As a result of the holes, the vertical pillars are formed, which are disposed between the even stacks (e.g. 2011-E) and odd stacks (e.g. 2011-O). The vertical pillars include vertical channel structures separated by insulating structure 2002 disposed between the stack 2011-E and the stack 2011-O in this example. The vertical channel structures comprise even and odd semiconductor films that act as vertical channel films, having outside surfaces and inside surfaces. The outside surfaces are disposed on and contact the data storage structures on the sidewalls of the corresponding even and odd stacks forming a 3D array of memory cells. The inside surfaces are separated by an insulating structure (e.g. 2000), which in this example includes a layer of insulating material and a gap in the regions of the memory cells. For thin channel embodiments, the even and odd semiconductor films in the vertical channel structures have thicknesses of 10 nm or less.

As illustrated in FIG. 10, the vertical pillars are laid out in a honeycomb arrangement, so that each row of vertical pillars is offset in the row direction from adjacent rows. This honeycomb arrangement facilitates formation of overlying bit lines with a tighter pitch. Insulating fill (not shown) is applied in the holes between the vertical pillars.

After the patterned hole etch, the thin-film semiconductor layer 1140 adopts the pattern of the array of holes on a top surface, resulting in a continuous semiconductor film over the tops of the stacks and connecting to the vertical channel films of the vertical pillars. In FIG. 10, a portion 1140-O of the thin-film semiconductor layer 1140 overlies the odd stack 2011-O. The portion 1140-E of the thin-film semiconductor layer 1140 overlies the even stack 2011-E and is continuous along the top of the stack 2011-E connecting the vertical channel films on the right sidewall of the insulating structure 2002, the vertical channel films on the left sidewall of the insulating structure 2003 and the vertical channel film on the left sidewall of the insulating structure 2004 in this illustration.

Figure 11:
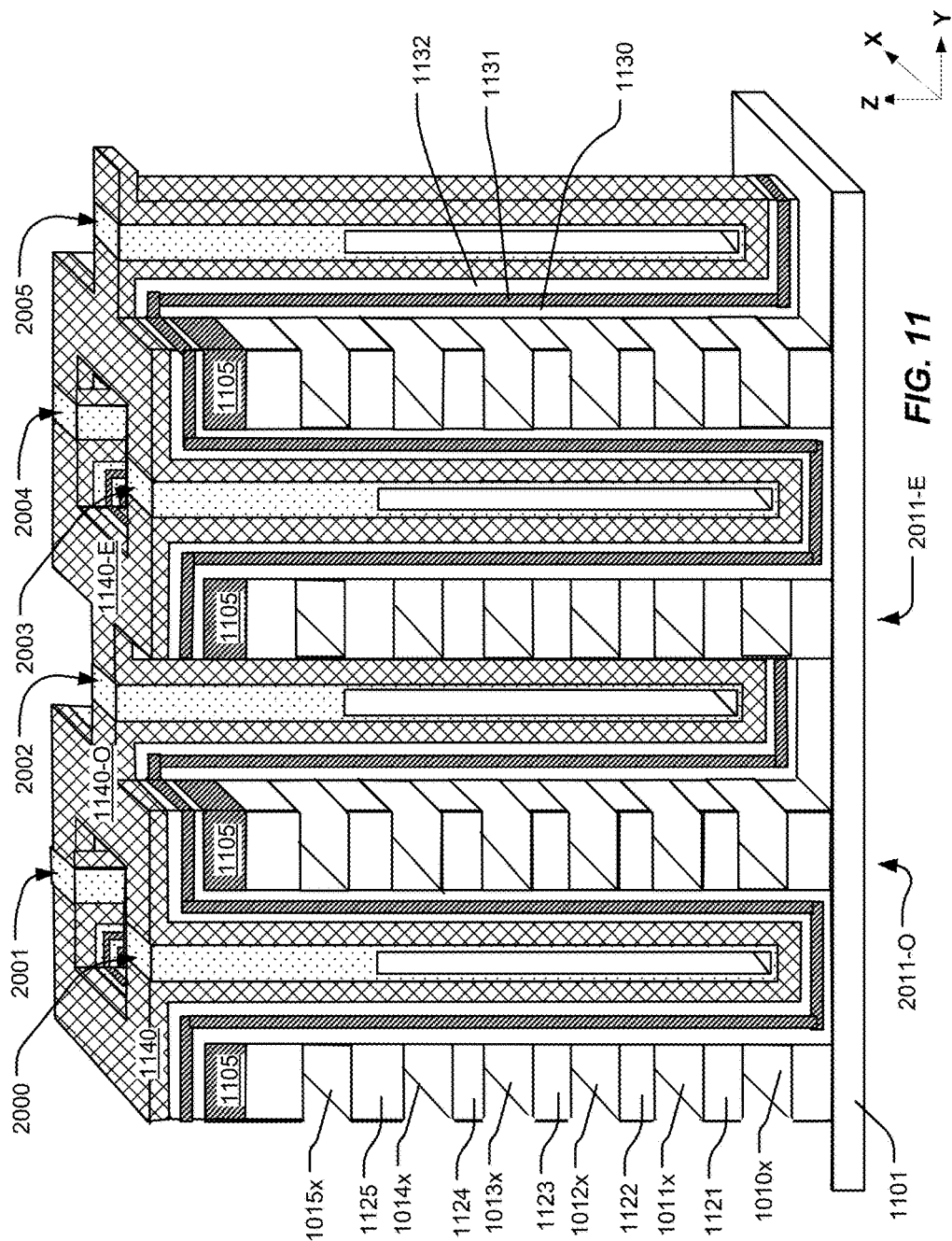

FIG. 11 shows the structure after applying a process to selectively remove the sacrificial strips in the stacks to form voids between the insulating strips. Thus, in the leftmost stack in the figure, voids 1010$x$, 1011$x$, 1012$x$, 1013$x$, 1014$x$, 1015$x$ are opened after removal of the corresponding sacrificial strips 1010-1015, where access for the removal of the sacrificial strips is provided through the vertical holes between the vertical pillars.

The sacrificial strips can be removed using a selective etch process. For example, etch chemistries suitable for selectively etching sacrificial strips containing germanium relative to silicon dioxide and silicon are described in Orlowski, et al., "Si, SiGe, Ge, and III-IV Semiconductor Nanomembranes and Nanowires Enabled by SiGe Epitaxy," ECS Transactions, 33 (6) 777-789 (2010) 10.1149/1.3487608 © The Electrochemical Society, which is incorporated by reference as if fully set forth herein. Orlowski describes three different etch chemistries for selective removal of SiGe or germanium relative to Si, including "chemical plasma etching using pure $CF_4$ as the etching gas in a downstream plasma reactor; HCl etching; and wet etching using the chemistry $HF/HNO_3/CH_3COOH$." (At page 780). These etch chemistries also can selectively remove SiGe or germanium relative to silicon dioxide. Orlowski also describes etch chemistries for removal of silicon relative to SiGe or Ge, including a dry etch method that "uses a combination of $CF_4/O_2/N_2$ gases;" and a wet etch method "using and oxidation agent such as $HNO_3$ or $H_2O_2$ with an etching agent (HF)." (At page 782).

As a result of the selective etching, the insulating strips (e.g. 1121-1125) remain suspended between the vertical pillars, with openings allowing access of the selective etch chemistry between the insulating strips in the vertical holes.

Figure 12:
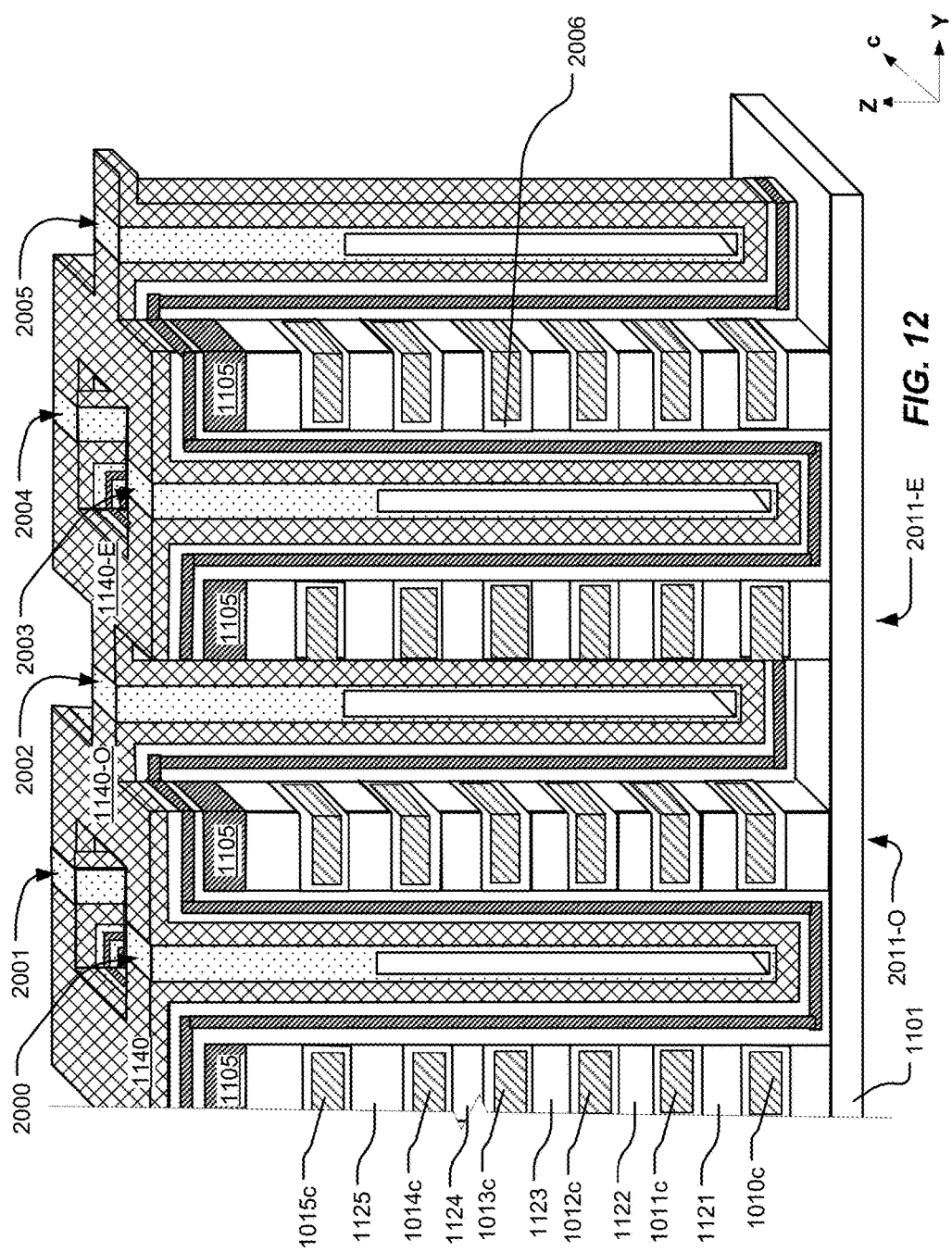

FIG. 12 shows the structure after filling the voids with a dielectric liner (e.g. 2006) and word line material in all of the voids to be used in the formation of conductive strips (e.g. strips 1010$c$, 1011$c$, 1012$c$, 1013$c$, 1014$c$, 1015$c$). The materials suitable for the dielectric liner and word line material can be selected as discussed above with reference to FIG. 5. After the filling of the voids, an etch process is used to clean the excess conductive material in the vertical holes, and a deposition process is used to fill the vertical holes with dielectric material (not shown). A high-κ dielectric liner can be deposited using highly conforming chemical vapor deposition or atomic layer deposition. Likewise, word line material can be deposited using highly conforming chemical vapor deposition or atomic layer deposition.

FIG. 13 shows the upper part of structure after doing a patterned etch to divide the thin-film semiconductor layer 1140 remaining over the stacks for the purposes of forming array connections. After the patterned etch, the thin-film semiconductor layer 1140 is divided into portions 2070 and 2071 which overlie the even stacks, and portions 2073, 2074, 2075, 2078 and 2079 which overlie the odd stacks. The portions 2070 and 2071 connect the vertical pillars (e.g. portion 2071 connects to portions 2076, 2077) on the common source side of the NAND strings together and provide landing areas for interlayer connectors for connection to a common source line. The portions 2073, 2074, 2075, 2078 and 2079 are separated and provide landing areas for interlayer connectors making independent connections to bit lines. In the illustration, the vertical pillar comprising vertical channel structure shows the pattern of the pad on the top of the vertical channel film on the SSL side of the NAND string, but on the GSL side of the NAND string, the illustration is incomplete.

FIG. 14 illustrates an upper part of the structure in a following stage after formation of an array of contact plugs (2020, 2021, 2022, 2023, 2024, 2025, 2026, 2027) through an interlayer dielectric (not shown), landing on corresponding portions of the thin-film semiconductor layer. The process can include formation of a layer of interlayer dielectric such as silicon oxide on top of the array, which can be for example about 100 nm to 500 nm thick, followed by formation of vias through the interlayer dielectric exposing the landing areas on the portions of the thin-film semiconductor layer. The contacts can comprise a polysilicon plug, or other material which is compatible with the conductive material used at the upper surfaces of the vertical channel structures. The contact plugs 2020, 2024 provide for electrical connection to portions 2070 and 2071 which are continuous with thin-channel films on the GSL sides of the vertical pillars. The contact plugs 2021, 2022, 2023, 2025, 2026, 2027 provide for electrical connection to portions 2073, 2074, 2075, 2078, 2079, and to the unlabeled portion on the SSL side of the vertical pillar comprising vertical channel structure, respectively, which are continuous with the thin-channel films on the SSL sides of the vertical pillars.

Figure 15:
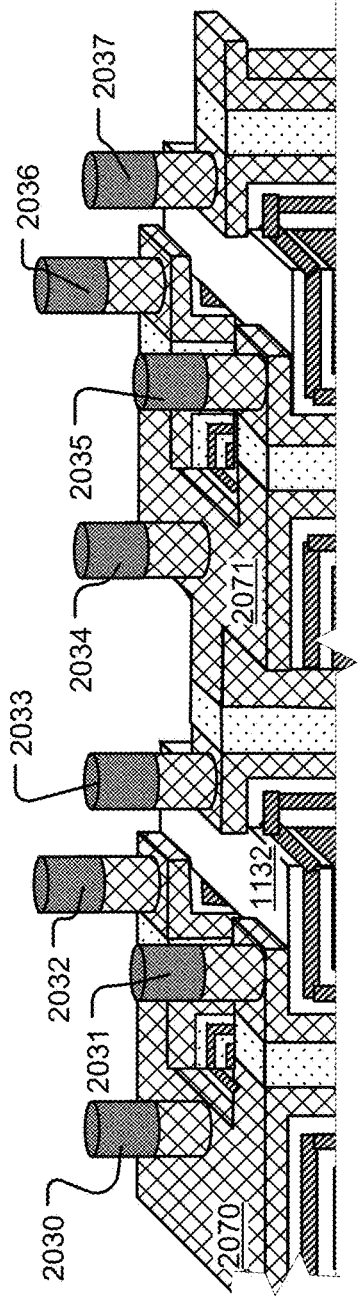

FIG. 15 illustrates an upper part of the structure in a following stage that includes formation of interlayer connectors (2030, 2031, 2032, 2033, 2034, 2035, 2036, 2037) which can comprise tungsten plugs or other metal materials in an interlayer dielectric which overlies an interlayer dielectric (not shown). The interlayer connectors 2030-2037 are aligned over and make electrical contact with the polysilicon contact plugs (e.g. 2027) in this example. The alignment can be carried out using a borderless silicon nitride process or other technique which provides for good electrical connection to the underlying polysilicon plugs in this embodiment.

In other embodiments, interlayer connection can be made using other combinations of materials, or using a single interconnection plug.

Figure 16:
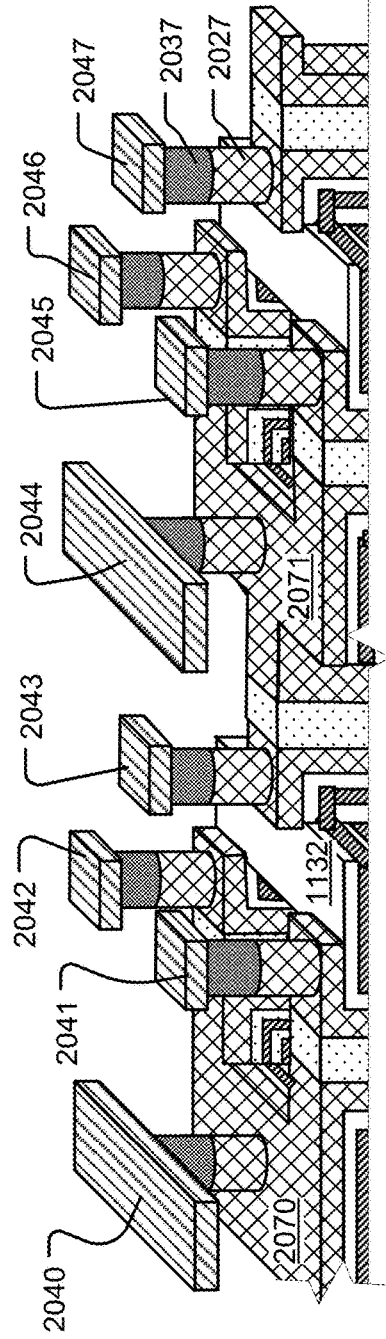

FIG. 16 illustrates the structure after a following stage that includes formation of a first patterned conductor layer including conductor lines 2040, 2044 and posts 2041, 2042, 2043, 2045, 2046, 2047 in contact with the interlayer connectors (e.g. 2037). The conductor lines 2040 and 2044 are connected to the GSL sides of the NAND strings and can be operated as common source lines in some array configurations. The posts 2041, 2042, 2043, 2045, 2046, 2047 provide for interconnection of the SSL sides of the NAND strings through the first patterned conductor layer to overlying patterned conductor layers as described below.

FIG. 17 illustrates the structure after a stage which includes forming of interlayer connectors 2051, 2052, 2053, 2055, 2056, 2057 for making connection of the SSL sides of the NAND strings to overlying patterned conductors via the posts (e.g. 2047) which are formed as described with reference to FIG. 16. The interlayer connectors 2051 can have an oval or elongated shape with a more narrow width (e.g. about 20 nm) in the X dimension to facilitate connection to a dense pattern of overlying bit lines.

FIG. 18 illustrates the structure after applying a second patterned conductor layer, such as a metal layer in a process flow, over the interlayer connectors 2051, 2052, 2053, 2055, 2056, 2057. The second patterned conductor layer includes bit lines 2060, 2061, 2062 in this example. The bit lines can be patterned using a self-aligned double patterning SADP process to achieve a narrow pitch. As illustrated in FIG. 18, the portion 2070 of the thin-film semiconductor layer which is connected to the vertical channel films on the GSL sides of NAND strings in vertical pillars along a row is connected by interlayer connectors to conductor line 2040 in the first patterned conductor layer, which acts as a source reference line. Likewise, the portion 2071 of the thin-film semiconductor layer which is connected to the vertical channel films on the GSL sides of NAND strings in vertical pillars along a row is connected by interlayer connectors to conductor line 2044 in the first patterned conductor layer, which acts as a source reference line. The portions 2073 and 2079 of the thin-film semiconductor layer which are connected to SSL sides of NAND strings in vertical pillars along a first column in the array are connected by interlayer connectors to a first bit line 2060. The portions 2075 and 2079 of the thin-film semiconductor layer which are connected to SSL sides of NAND strings in vertical pillars along a column in the array are connected by interlayer connectors to a second bit line 2061. The portions 2074 and 2078 of the thin-film semiconductor layer which are connected to SSL sides of NAND strings in vertical pillars along a column in the array are connected by interlayer connectors to a third bit line 2062.

The structure shows a plurality of vertical pillars between corresponding even and odd stacks of conductive strips. The vertical pillars comprise semiconductor films having outside surfaces and inside surfaces. The outside surfaces are disposed on the data storage structures on the sidewalls of the corresponding even and odd stacks forming a 3D array of memory cells. The memory cells are connected to form a current path from an upper end to a lower end of the even vertical channel film, and from a lower end to an upper end of the odd vertical channel film.

FIG. 18 shows a memory device in which stacks of conductive strips are separated by trenches. Referring to the dielectric lined, conductive strips in first and second stacks, a configuration for interconnection to the U-shaped NAND strings can be described. The first and second stacks of conductive strips have sidewalls on first and second sides of the trench separating the stacks. Data storage structures are formed on the sidewalls of the strips in the trenches. Vertical pillars are disposed in the trenches between the first and second stacks. Each vertical channel structure includes a first semiconductor film and a second semiconductor film disposed vertically in contact with the data storage structures on opposing sides of the trench, which are electrically connected at the bottom of the trench. An upper strip of a first stack is configured as a gate of a first switch, e.g. an SSL switch, having a channel in the first semiconductor film, and an upper strip of a second stack is configured as a gate of a second switch, e.g. a GSL switch having a channel in the second semiconductor film. Intermediate strips in the first and second stacks are configured as word lines. Bottom strips in the first and second stacks are configured as assist gates. A patterned conductor layer or layers overlie the stacks. A first interlayer connector connects a first conductor (e.g. bit line 2060) to a top surface of the first semiconductor film in a vertical pillar. A second interlayer connector connects a second conductor (e.g. conductor line 2040) to a top surface of the second semiconductor film in a vertical channel structure. Also, additional vertical pillars disposed between the same first and second stacks are configured so that the second semiconductor films on the second side of the trench are all electrically connected, and can share connection to the same source reference line. Furthermore, the additional vertical pillars between the same first and second stacks are configured so that the first semiconductor films on the first side of the trench are electrically separated, and can be individually connected to separate bit lines using individual interlayer connectors (e.g. third interlayer connectors).

A vertical channel structure between the third stack and the second stack includes a first semiconductor film along the first side of the trench on the sidewall of the second stack between the third and second stacks, and a second semiconductor film along a second side of the trench between the third and second stacks. The first semiconductor film of the vertical channel structure between the third stack and the second stack can be electrically connected (by portion 2071) to the second semiconductor film of the vertical channel structure between the first stack and the second stack.

Figure 19:
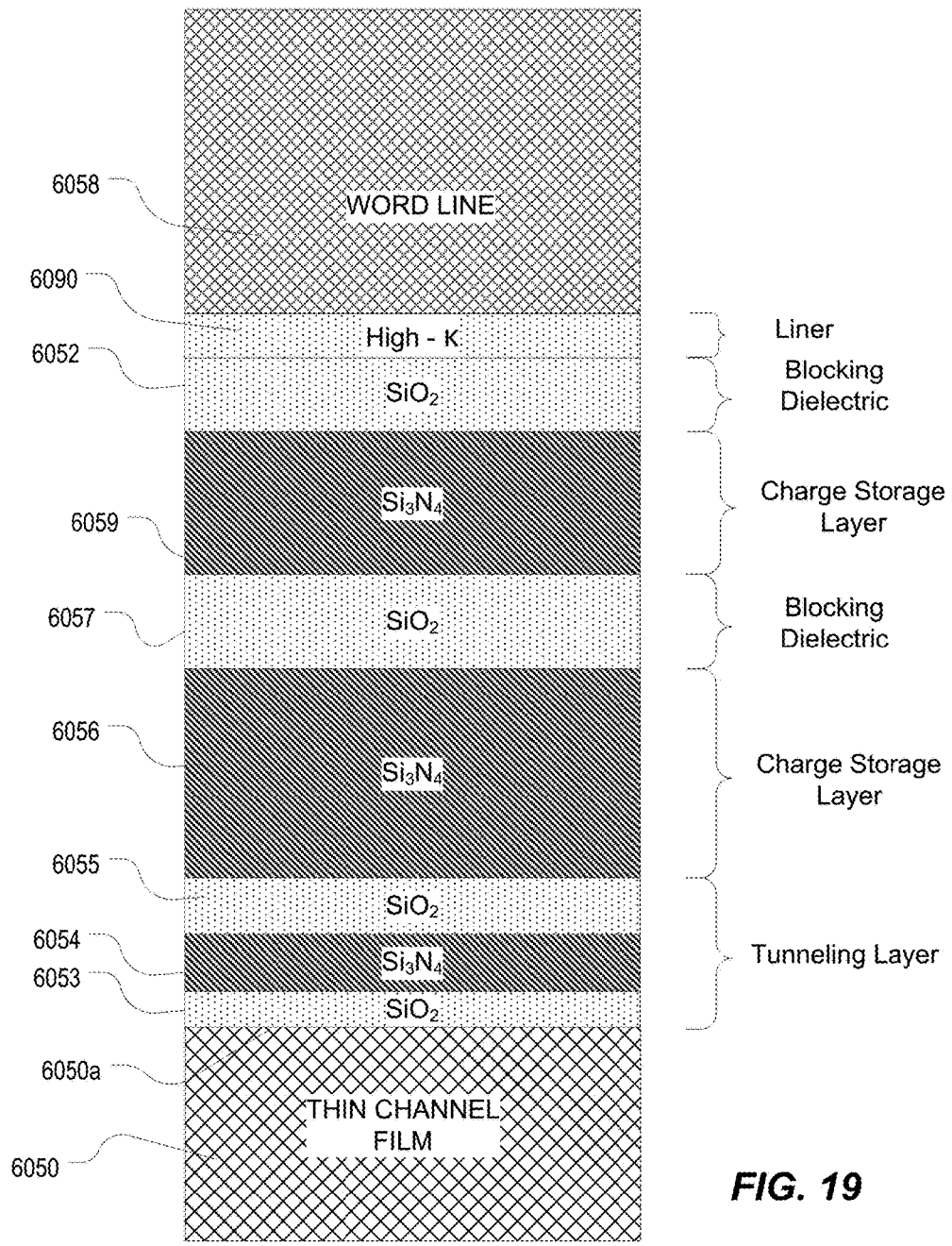
FIG. 19 illustrates one type of data storage structure which can be utilized in 3D NAND memory as described herein.

FIG. 19 is a simplified diagram of an improved BE-SONOS dielectric charge storage layer that can be utilized in the structure described herein. Other charge storage structures can be utilized as well, including the types discussed above.

The dielectric charge trapping structure includes a tunneling layer in contact with the vertical channel structure 6050, which comprises a composite of materials and includes multiple layers, including a first tunneling layer 6053 of silicon oxide, a tunneling layer 6054 of silicon nitride, and a second tunneling layer 6055 of silicon oxide.

The first tunneling layer 6053 of silicon dioxide on the surface 6050a of the channel structure 6050 is formed for example using in-situ steam generation ISSG with optional nitridation by either a post deposition NO anneal or by addition of NO to the ambient during deposition. The thickness of the first tunneling layer 6053 of silicon dioxide is less than 20 Å, and preferably 7-15 Å. The first tunneling layer 6053 can be engineered with alternatives such as nitrided oxide for improved endurance, and/or fluorine treatments for improved interface state quality.

The tunneling layer 6054 of silicon nitride, also referred to as a tunneling nitride layer, lies on the first tunneling layer 6053 of silicon oxide formed for example using low-pressure chemical vapor deposition LPCVD, using for example dichlorosilane DCS and $NH_3$ precursors at 680 degrees C. In alternative processes, the tunneling nitride layer comprises silicon oxynitride, made using a similar process with an $N_2O$ precursor. The thickness of the tunneling layer 6054 of silicon nitride is less than 30 Å, and preferably 10-30 Å, including for example 20 Å. Because of its thinness, tunneling layer 6054 is poor at storing charge.

Tunneling layer 6054 provides a low hole barrier height to facilitate hole injection for FN erasing. However, tunneling layer 6054 has a low trapping efficiency. Various materials for tunneling layer 6054, along with their valence band offsets with silicon are: $SiO_2$ 4.4 eV, $Si_3N_4$ 1.8 eV, $Ta_2O_5$ 3.0 eV, $BaTiO_3$ 2.3 eV, $BaZrO_3$ 3.4 eV, $ZrO_2$ 3.3 eV, $HfO_2$ 3.4 eV, $Al_2O_3$ 4.9 eV, $Y_2O_3$ 3.6 eV, $ZrSiO_4$ 3.4 eV. $Si_3N_4$ has the lowest hole barrier height with 1.8 eV, although other materials are possible.

The second tunneling layer 6055 of silicon dioxide lies on the tunneling layer 6054 of silicon nitride and is formed for example using LPCVD high temperature oxide HTO deposition. The thickness of the second tunneling layer 6055 of silicon dioxide is less than 45 Å, and preferably 15-45 Å, for example 30 Å. The second tunneling layer 6055 provides sufficient barrier thickness to block charge loss for improved charge retention. The second tunneling layer 6055 blocks direct tunneling leakage. Other low leakage oxides such as $Al_2O_3$ are possible.

A first charge storage layer 6056 in this embodiment comprises silicon nitride having a thickness greater than 45 Å, and preferably 45-80 Å, including for example about 55 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on. A variety of charge trapping materials is described in the above referenced U.S. Patent Application Publication No. 2006/0261401 A1, entitled "Novel Low Power Non-Volatile Memory and Gate Stack", by Bhattacharyya, published 23 Nov. 2006, now U.S. Pat. No. 7,612,403. High charge trapping efficiency alternatives are oxynitride, silicon-rich nitride, embedded nanoparticles, and $HfO_2$.

A first blocking layer 6057 of silicon dioxide lies on the first charge storage layer 6056 and is formed for example using LPCVD high temperature oxide HTO deposition. The thickness of the first blocking layer 6057 of silicon dioxide is less than 70 Å, including for example a range of 55-70 Å, including for example 50 Å. The first blocking layer 6057 provides sufficient barrier thickness to block charge mixing and charge transport between the charge storage layers 6056 and 6059. Other low leakage oxides such as $Al_2O_3$ are possible.

A second charge storage layer 6059 in this embodiment comprises silicon nitride having a thickness greater than 30 Å, including for example a range of 30-60 Å, including for example about 40 Å in this embodiment formed, for example, using LPCVD. Other embodiments are similar to the first charge trapping layer. The second charge storage layer 6059 traps electrons during —FN erasing to stop gate electron injection, allowing continuous erase of first charge storage layer 6056 by channel hole injection. High charge trapping efficiency alternatives are oxynitride, silicon-rich nitride, embedded nanoparticles, and $HfO_2$.

A second blocking layer 6052 of silicon dioxide lies on the second charge storage layer 6059 and is formed for example using LPCVD high temperature oxide HTO deposition. The thickness of the second blocking layer 6052 of silicon dioxide is less than 60 Å, including for example a range of 30-60 Å, including for example 35 Å. In some embodiments, layers 6052 and 6059 may be omitted.

Finally, a layer 6058 of word line material formed using the process described above with a dielectric liner 6090 is disposed in contact with the outside surface of the second blocking layer 6052.

Figure 20A:
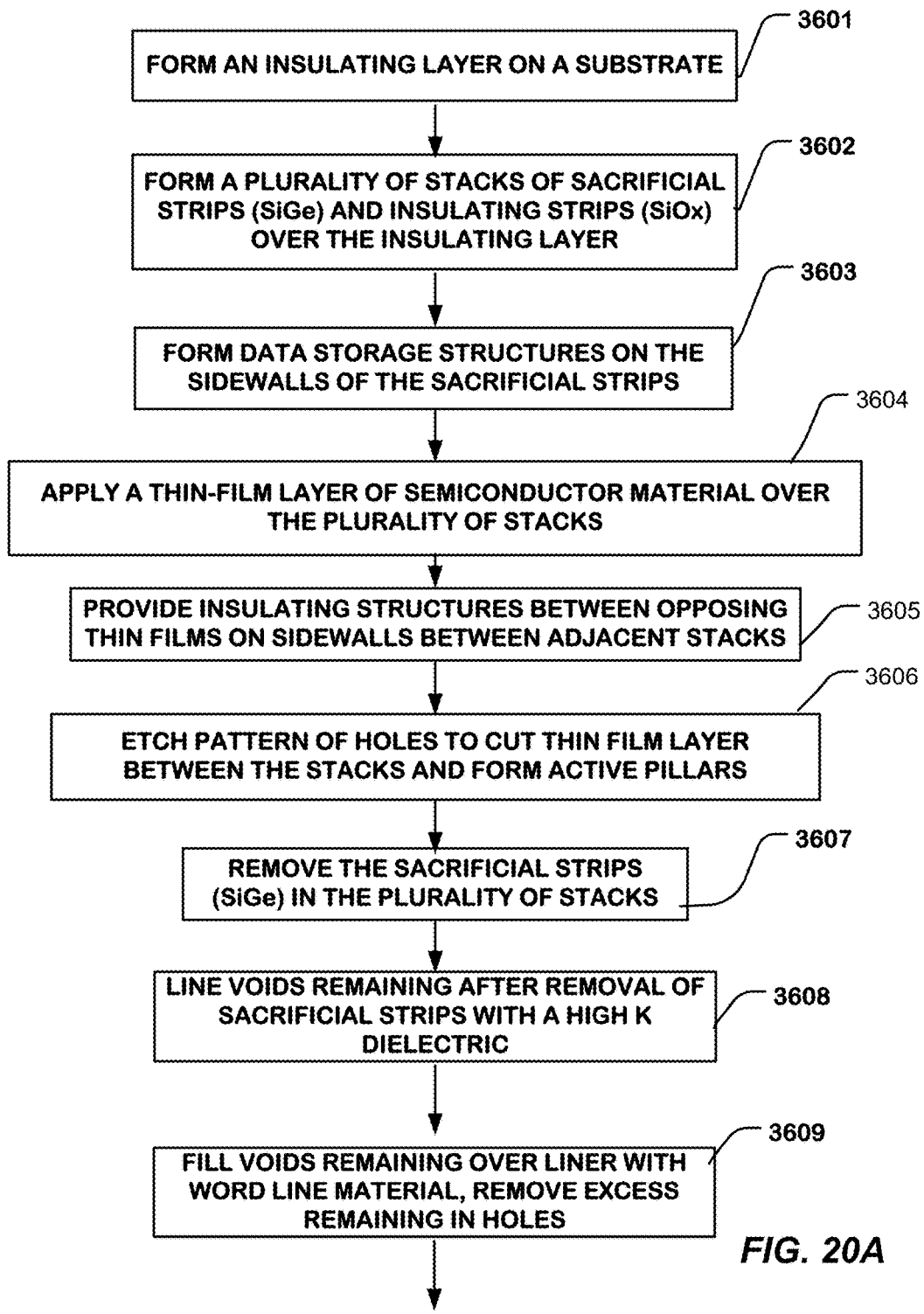
FIGS. 20A and 20B are a flow chart illustrating a method for manufacturing a memory device as described herein.
Figure 20B:
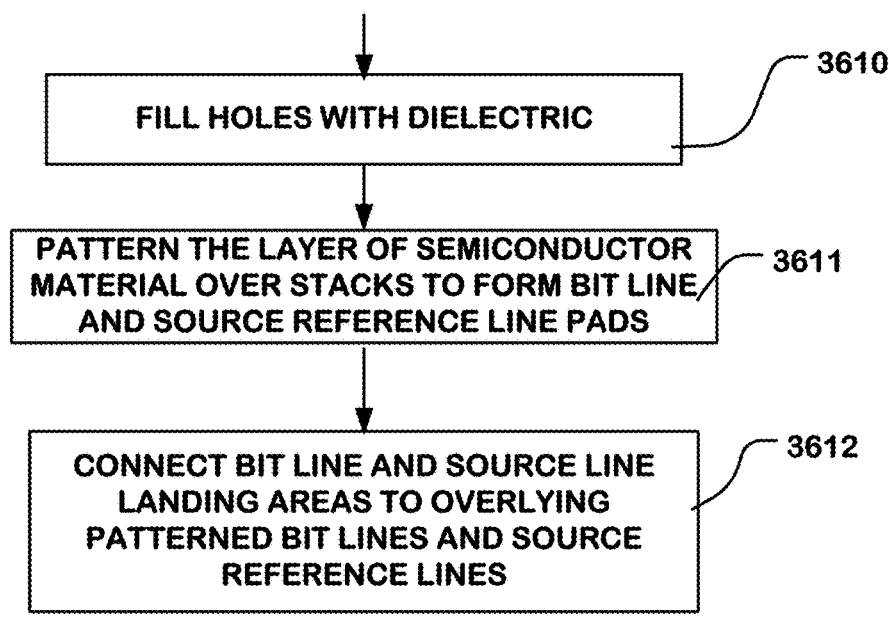

FIGS. 20A and 20B are a flow chart illustrating a method for manufacturing a memory device. The method includes identifying areas on a substrate for formation of 3D memory blocks having a structure like that of FIG. 18. For each area, the method includes forming an insulating layer on the substrate by, for example, depositing a layer of silicon dioxide, or other dielectric material or combination of materials on the substrate (3601). Over the insulating layer (e.g., 1101 in FIG. 18), the process includes forming a plurality of layers of a sacrificial material, to be replaced by a material suitable to act as word lines, separated by an insulating material, and etching the plurality of layers to define a plurality of stacks (1110, 1111, etc. in FIG. 6) of alternating sacrificial and insulating strips (3602).

The method includes forming a data storage structure comprising a memory layer on the sidewalls of the sacrificial strips in the plurality of stacks to provide data storage structures (3603). The data storage structure can comprise a dielectric charge trapping structure as discussed above. An outside surface of the data storage structure contacts the sidewalls of the plurality of sacrificial strips.

The method includes forming a thin-film layer (e.g. 1140 in FIG. 10) of a semiconductor material over and having a surface conformal with the memory layer on the plurality of stacks. The thin-film extends down the sidewalls of the trenches between the stacks, and over the bottom of the trenches (3604).

An insulating structure (e.g. fill 1160 in FIG. 11) is provided between the opposing thin films on the sidewalls of adjacent stacks (3605). In some embodiments, the insulating structure includes a gap at least in the regions of the memory cells being formed. This step of providing an insulating structure can comprise simply leaving the gap separating the thin films on opposing sides of the trenches without treatment.

Then, the structures between the plurality of stacks of sacrificial strips are etched using a pattern of holes to define vertical pillars that include separated, thin vertical channel films in the regions of the memory cells as discussed with reference to FIG. 12 (3606).

In a next step, the sacrificial strips are removed via the holes (3607). Then, the voids formed by removal of the sacrificial strips are lined with a dielectric material, preferably a high-κ dielectric material as discussed above (3608). After lining the voids, the voids are filled with a word line material, and the excess material is removed from the remaining holes (3609). The holes are then filled with a dielectric material and the structure prepared for formation of the overlying patterned of connectors (3610).

The layer of semiconductor material overlying the stacks is patterned to define bit line pads and source reference line pads (3611). The vertical pillars include one vertical channel film connected to a bit line pad (e.g. portion 2073), and one vertical channel film connected to a source reference line pad (e.g. portion 2070). More than one vertical pillar can share a source reference line pad. However, each vertical pillar is connected to a single bit line pad.

The method can further include forming a first overlying patterned conductor layer with interlayer connectors connected to the plurality of bit line pads, including a plurality of global bit lines coupled to sensing circuits, and forming a second overlying patterned conductor layer connected to the source reference line pads, coupled to a reference voltage source as discussed with reference to FIG. 18 (3612). Also, the same or additional patterned conductor layers can include conductors coupled to the SSL strips, to the GSL strips and to the word line pads in the stacks of conductive strips.

With all flowcharts herein, it will be appreciated that many of the steps can be combined, performed in parallel or performed in a different sequence without affecting the functions achieved. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

As a result of forming the vertical pillars, memory cells are formed at each frustum of the pillars in interface regions at cross-points on opposing side surfaces of the dielectric lined conductive strips in the plurality of intermediate planes (WLs) with the thin vertical channel films of the plurality of bit line structures. Also, string select switches are disposed at interface regions with the top plane of conductive strips (SSLs) in even stacks, and reference select switches are disposed at interface regions with the top plane (GSL) of conductive strips in odd stacks. The memory layer can comprise dielectric layers that can act as the gate dielectric layers for the string select switches and reference select switches.

With reference to FIGS. 20A-20B and other disclosure herein, several aspects of the manufacturing process can be understood. In one aspect, a manufacturing method is described which includes forming a plurality of vertical pillars having sidewalls, a vertical pillar in the plurality comprising a vertical channel and a multilayer data storage structure having an outside layer on the sidewall of the pillar; and forming a stack of dielectric lined conductive strips separated in the stack by insulating strips, where the dielectric liner is disposed at least on the sidewalls of the conductive strips in contact with the outside layer of the multilayer data storage structure.

The process of forming the vertical pillars comprises in some aspects described herein forming alternating layers of an insulating material and a sacrificial material, and etching trenches in the alternating layers to form a plurality of stacks of sacrificial strips separated by insulating strips in the stacks. Then, multilayer data storage structures are formed on the sidewalls of the trenches and a semiconductor channel material is disposed over the multilayer data storage structures. Holes are etched through the semiconductor channel material and the multilayer data storage structure to form vertical pillars in the trenches and to expose the sacrificial strips between the vertical pillars. The stack of conductive strips is formed by selective removal of the sacrificial strips, and replacing them by a dielectric lined conductive material as discussed above.

Figure 21:
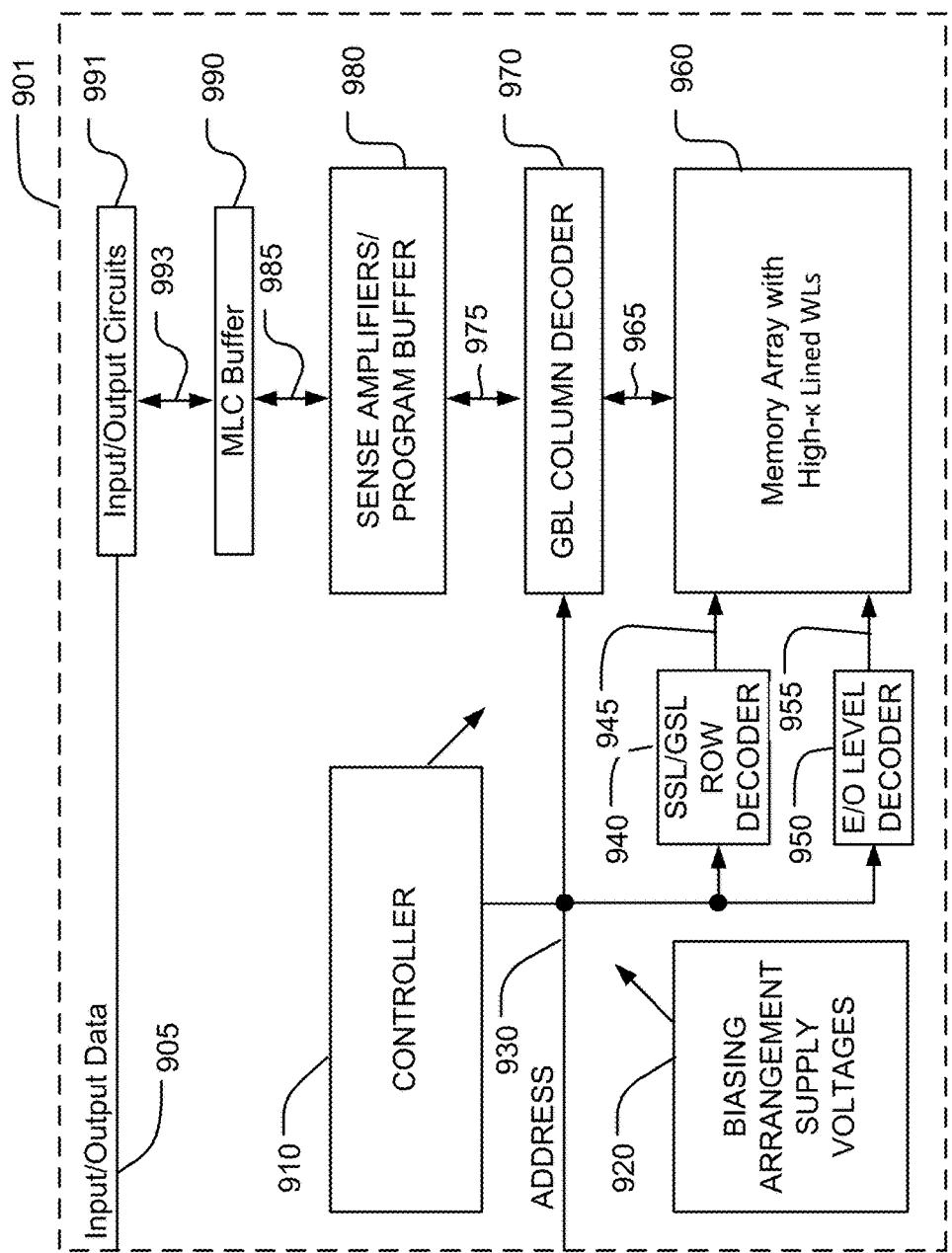
FIG. 21 is a block diagram of an integrated circuit memory including a 3D memory array having high-κ liners on word lines.

FIG. 21 is a simplified chip block diagram of an integrated circuit 901 including a 3D, vertical thin-channel film NAND array in which the word lines comprise horizontal strips of word line material having a dielectric liner. The word line material can consist of a metal or metal nitride, and the dielectric liner can consist of a high-κ dielectric or a silicon nitride. The integrated circuit 901 includes a memory array 960 including one or more memory blocks as described herein with U-shaped NAND strings comprising vertical channel cells on an integrated circuit substrate in some embodiments. In other embodiments, different types of 3D memory structures can be implemented using the dielectric lined word line structures described herein.

An SSL/GSL decoder 940 is coupled to a plurality of SSL/GSL lines 945, arranged in the memory array 960. An even/odd level decoder 950 is coupled to a plurality of even/odd word lines 955. A global bit line column decoder 970 is coupled to a plurality of global bit lines 965 arranged along columns in the memory array 960 for reading data from and writing data to the memory array 960. Addresses are supplied on bus 930 from control logic 910 to column decoder 970, decoder 940 and decoder 950. Sense amplifier and program buffer circuits 980 are coupled to the column decoder 970, in this example via first data lines 975. The program buffer in circuits 980 can store program codes for multiple-level programming, or values that are a function of the program codes, to indicate program or inhibit states for selected bit lines. The column decoder 970 can include circuits for selectively applying program and inhibit voltages to bit lines in the memory in response to the data values in the program buffer.

Sensed data from the sense amplifier/program buffer circuits are supplied via second data lines 985 to multi-level data buffer 990, which is in turn coupled to input/output circuits 991 via a data path 993. Also, input data is applied in this example to the multi-level data buffer 990 for use in support of multiple-level program operations.

Input/output circuits 991 drive the data to destinations external to the integrated circuit 901. Input/output data and control signals are moved via data bus 905 between the input/output circuits 991, the control logic 910 and input/output ports on the integrated circuit 901 or other data sources internal or external to the integrated circuit 901, such as a general purpose processor or special purpose application circuitry, or a combination of modules providing system-on-a-chip functionality supported by the memory array 960.

In the example shown in FIG. 21, control logic 910, using a bias arrangement state machine, controls the application of supply voltages generated or provided through the voltage supply or supplies in block 920, such as read, erase, verify and program bias voltages. The control logic 910 is coupled to the multi-level data buffer 990 and the memory array 960. The control logic 910 includes logic to control multiple-level program operations.

In some embodiments, the logic is configured to store multiple levels of charge to represent more than one bit of data in the charge trapping sites in the selected layer on the selected side. In this manner, a selected cell in a selected frustum of a vertical pillar in the array stores more than two bits, including more than one bit on each side of the cell.

The control logic 910 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The memory array 960 can comprise charge trapping memory cells configured to store multiple bits per cell, by the establishment of multiple program levels that correspond to amounts of charge stored, which in turn establish memory cell threshold voltages VT. As mentioned above, single-bit-per-cell embodiments can include the structures described herein.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A manufacturing method, comprising: forming a vertical pillar having a sidewall, and comprising a vertical channel and multilayer data storage structure having an outside surface on the sidewall; and forming a stack of conductive strips separated in the stack by insulating strips, the conductive strips having upper and lower surfaces and sidewalls including dielectric liners having a dielectric constant K greater than 7 lining the upper and lower surfaces of the conductive strips and the sidewalls, the dielectric liners of the conductive strips in the stack in contact with the outside surface of the multilayer data storage structure of the vertical pillar.

2. The method of claim 1, wherein said forming a vertical pillar comprises:
   forming alternating layers of an insulating material and a sacrificial material;
   etching trenches in the alternating layers to form a plurality of stacks of sacrificial strips separated by the insulating strips in the stacks;
   forming multilayer data storage structures on the sidewalls of the trenches;
   forming a semiconductor channel material over the multilayer data storage structures in the trenches; and
   etching holes through the semiconductor channel material to form a plurality of vertical pillars including the first mentioned vertical pillar in the trenches, the holes exposing the sacrificial strips between the vertical pillars in the plurality of vertical pillars.

3. The method of claim 2, wherein said forming a stack of conductive strips separated in the stacks by insulating strips comprises:
   selectively removing the sacrificial strips in the stacks to form voids between the insulating strips;
   lining the voids with a dielectric material to form the dielectric liners; and
   filling the voids over the dielectric liners with a word line material to form the conductive strips.

4. The method of claim 3, wherein the sacrificial material comprises germanium and the vertical channel comprises silicon.

5. The method of claim 3, wherein the sacrificial material comprises silicon and the vertical channel comprises germanium or silicon-germanium.

6. The method of claim 3, wherein the sacrificial material comprises germanium or silicon-germanium.

7. The method of claim 3, wherein the conductive word line material comprises a metal.

8. The method of claim 1, wherein the dielectric liners comprise a material different than the insulating strips.

9. The method of claim 1, wherein the multilayer data storage structure comprises a tunneling layer, a dielectric charge storage layer and a blocking layer, and where an outside layer of the multilayer data storage structure is the blocking layer.

10. A memory device including a plurality of memory cells, comprising:
    a vertical pillar having a sidewall, and comprising a vertical channel and multilayer data storage structure having an outside surface on the sidewall; and
    a stack of conductive strips separated in the stack by insulating strips, the conductive strips having upper and lower surfaces and sidewalls and including dielectric liners having a dielectric constant $\kappa$ greater than 7 lining the upper and lower surfaces of the conductive strips and the sidewalls in contact with the outside surface of the multilayer data storage structure.

11. The memory device of claim 10, wherein the conductive strips comprise a metal.

12. The memory device of claim 10, wherein the vertical channel comprises germanium or silicon-germanium.

13. The memory device of claim 10, wherein the dielectric liners comprise a material different than the insulating strips.

14. The memory device of claim 10, wherein the multilayer data storage structure comprises a tunneling layer, a dielectric charge storage layer and a blocking layer, and where an outside layer of the multilayer data storage structure is the blocking layer.

* * * * *